United States Patent
Izumi et al.

(10) Patent No.: US 8,455,287 B2
(45) Date of Patent: Jun. 4, 2013

(54) METHOD FOR MANUFACTURING SEMICONDUCTOR DEVICE INCLUDING MICROSTRUCTURE

(75) Inventors: Konami Izumi, Kanagawa (JP); Mayumi Yamaguchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/219,784

(22) Filed: Aug. 29, 2011

(65) Prior Publication Data

US 2011/0312118 A1 Dec. 22, 2011

Related U.S. Application Data

(60) Division of application No. 12/482,761, filed on Jun. 11, 2009, now Pat. No. 8,008,737, which is a continuation of application No. 11/420,150, filed on May 24, 2006, now Pat. No. 7,560,789.

(30) Foreign Application Priority Data

May 27, 2005 (JP) ................................. 2005-156472

(51) Int. Cl.
*H01L 21/00* (2006.01)
(52) U.S. Cl.
USPC .............. 438/52; 438/48; 438/50; 438/455; 438/456
(58) Field of Classification Search
USPC ......................... 438/107, 458–464
See application file for complete search history.

(56) References Cited

U.S. PATENT DOCUMENTS

| 5,374,564 A | * | 12/1994 | Bruel | ............................ 438/455 |
| 5,403,772 A | | 4/1995 | Zhang et al. | |
| 5,417,111 A | | 5/1995 | Sherman et al. | |
| 5,550,090 A | | 8/1996 | Ristic et al. | |
| 5,798,283 A | | 8/1998 | Montague et al. | |
| 5,808,331 A | | 9/1998 | Zhang et al. | |
| 5,882,960 A | | 3/1999 | Zhang et al. | |
| 5,888,858 A | | 3/1999 | Yamazaki et al. | |
| 5,895,933 A | | 4/1999 | Zhang et al. | |
| 5,985,740 A | | 11/1999 | Yamazaki et al. | |
| 6,063,654 A | | 5/2000 | Ohtani | |
| 6,077,731 A | | 6/2000 | Yamazaki et al. | |
| 6,093,934 A | | 7/2000 | Yamazaki et al. | |
| 6,100,562 A | | 8/2000 | Yamazaki et al. | |
| 6,144,082 A | | 11/2000 | Yamazaki et al. | |

(Continued)

FOREIGN PATENT DOCUMENTS

| EP | 0631325 A2 | 12/1994 |
| EP | 0762510 A2 | 3/1997 |

(Continued)

OTHER PUBLICATIONS

Korean Office Action (KR Application No. 2006-0047344) dated Aug. 16, 2012 with English translation, 9 pages.

*Primary Examiner* — Dung A. Le
(74) *Attorney, Agent, or Firm* — Fish & Richardson P.C.

(57) ABSTRACT

A method for manufacturing a semiconductor device is provided, which includes the step of forming a microstructure comprising a layer containing silicon over a first substrate, the step of forming an interlayer insulating layer over the microstructure, the step of forming a connection conductive layer over the interlayer insulating layer, and the step of separating the microstructure from the first substrate.

32 Claims, 16 Drawing Sheets

U.S. PATENT DOCUMENTS

| | | |
|---|---|---|
| 6,180,439 B1 | 1/2001 | Yamazaki et al. |
| 6,465,287 B1 | 10/2002 | Yamazaki et al. |
| 6,528,820 B1 | 3/2003 | Yamazaki et al. |
| 6,531,331 B1 | 3/2003 | Bennett et al. |
| 6,534,382 B1 * | 3/2003 | Sakaguchi et al. ............ 438/455 |
| 6,607,934 B2 | 8/2003 | Chang et al. |
| 6,608,357 B1 | 8/2003 | Yamazaki et al. |
| 6,686,638 B2 | 2/2004 | Fischer et al. |
| 6,730,549 B1 | 5/2004 | Zhang et al. |
| 6,744,069 B1 | 6/2004 | Yamazaki et al. |
| 6,756,657 B1 | 6/2004 | Zhang et al. |
| 6,813,054 B2 | 11/2004 | Aksyuk et al. |
| 6,821,342 B2 * | 11/2004 | Mattes et al. .................. 117/89 |
| 6,822,293 B2 | 11/2004 | Yamazaki et al. |
| 6,860,939 B2 | 3/2005 | Hartzell |
| 7,056,381 B1 | 6/2006 | Yamazaki et al. |
| 7,078,768 B2 | 7/2006 | Yamazaki et al. |
| 7,081,647 B2 | 7/2006 | Mushika |
| 7,148,094 B2 | 12/2006 | Zhang et al. |
| 7,335,971 B2 | 2/2008 | Funk |
| 7,642,612 B2 | 1/2010 | Izumi et al. |
| 2003/0133588 A1 | 7/2003 | Pedersen |
| 2003/0196590 A1 | 10/2003 | Hartzell |
| 2003/0196591 A1 | 10/2003 | Hartzell |
| 2003/0196592 A1 | 10/2003 | Hartzell |
| 2003/0196593 A1 | 10/2003 | Hartzell |
| 2003/0197214 A1 | 10/2003 | Hartzell |
| 2004/0020303 A1 | 2/2004 | Blomberg |
| 2004/0147056 A1 | 7/2004 | McKinnell et al. |
| 2005/0130360 A1 | 6/2005 | Zhan et al. |
| 2005/0153475 A1 | 7/2005 | Hartzell |
| 2005/0205515 A1 | 9/2005 | Saga et al. |
| 2006/0181368 A1 | 8/2006 | Naniwada |
| 2006/0210106 A1 | 9/2006 | Pedersen |
| 2006/0218785 A1 | 10/2006 | Horiuchi et al. |
| 2006/0278878 A1 | 12/2006 | Yamazaki et al. |
| 2008/0105935 A1 | 5/2008 | Ogura et al. |
| 2008/0237826 A1 | 10/2008 | Funk |

FOREIGN PATENT DOCUMENTS

| | | |
|---|---|---|
| EP | 1026751 A2 | 8/2000 |
| EP | 1026752 A2 | 8/2000 |
| EP | 1443016 A2 | 8/2004 |
| EP | 1464615 A2 | 10/2004 |
| JP | 61-212052 A | 9/1986 |
| JP | 07-321339 A | 12/1995 |
| JP | 09-007946 A | 1/1997 |
| JP | 09-129896 A | 5/1997 |
| JP | 09246569 A | 9/1997 |
| JP | 10-056186 A | 2/1998 |
| JP | 10048246 A | 2/1998 |
| JP | 10062447 A | 3/1998 |
| JP | 2000-036599 A | 2/2000 |
| JP | 2000-208018 A | 7/2000 |
| JP | 2002-270462 A | 9/2002 |
| JP | 2002-301695 A | 10/2002 |
| JP | 2004-001201 A | 1/2004 |
| JP | 2004235638 A | 8/2004 |
| JP | 2004-304189 A | 10/2004 |
| JP | 2005125484 A | 5/2005 |
| JP | 2007-021713 A | 2/2007 |

* cited by examiner

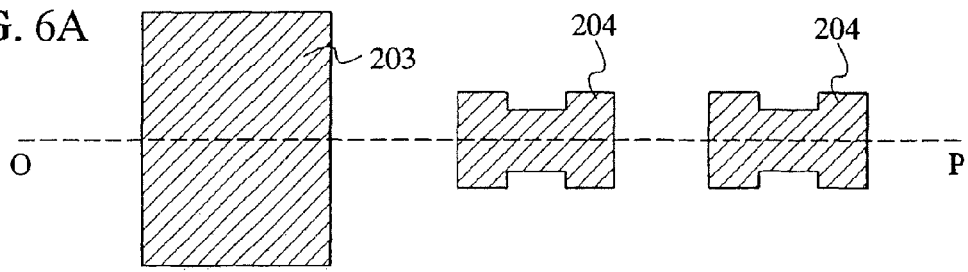
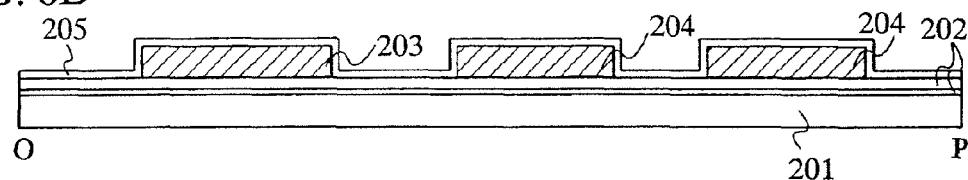
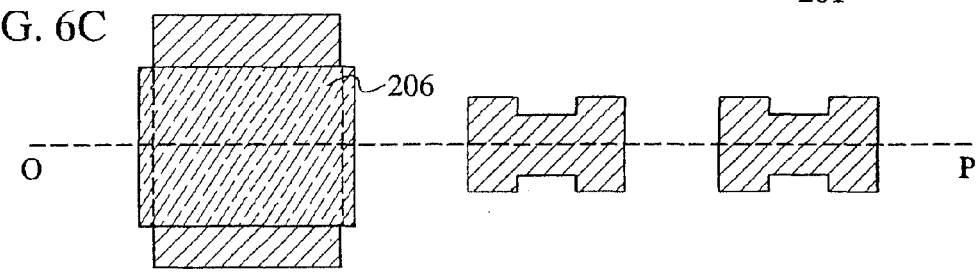
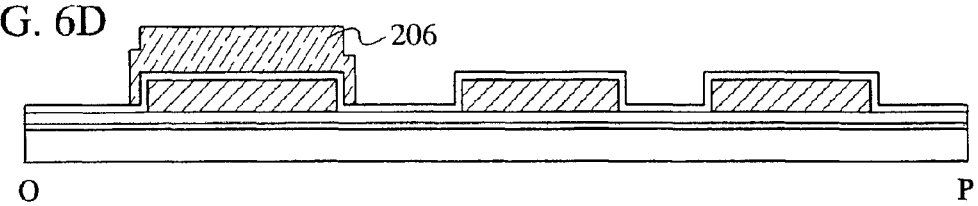
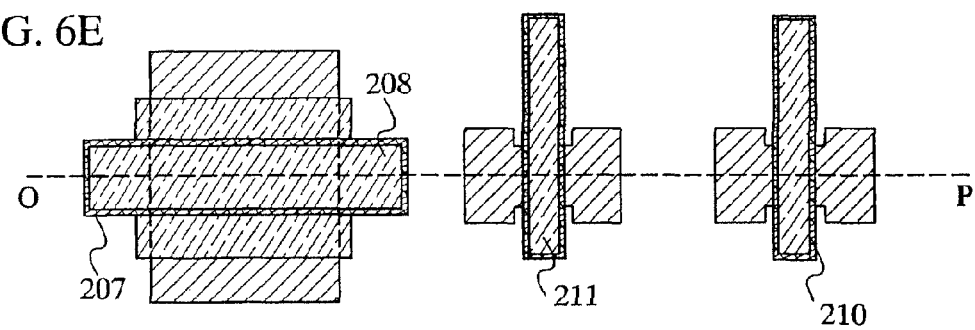
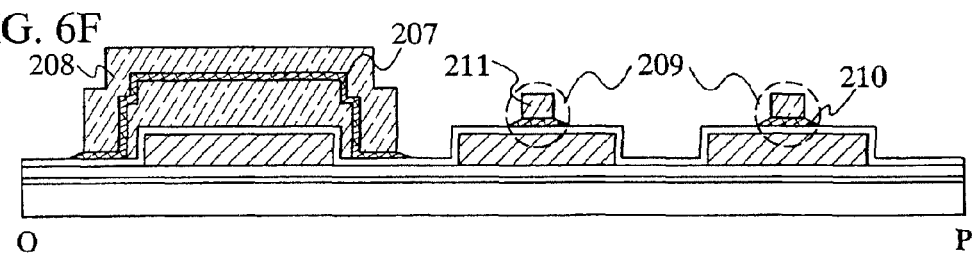

METHOD FOR MANUFACTURING SEMICONDUCTOR DEVICE INCLUDING MICROSTRUCTURE

CROSS-REFERENCE TO RELATED APPLICATIONS

This application is a divisional of U.S. application Ser. No. 12/482,761, filed Jun. 11, 2009, now allowed, which is a continuation of U.S. application Ser. No. 11/420,150, filed May 24, 2006, now U.S. Pat. No. 7,560,789, which claims the benefit of a foreign priority application filed in Japan as Serial No. 2005-156472 on May 27, 2005, all of which are incorporated by reference.

BACKGROUND OF THE INVENTION

1. Field of the Invention

The present invention relates to a semiconductor device having a microstructure and a semiconductor element over one substrate, and a method for manufacturing the same.

2. Description of the Related Art

In recent years, research on micro machine systems called MEMS has been actively undertaken. MEMS is an abbreviation of MicroElectroMechanical System, and may be called simply a micromachine. A micromachine generally refers to micro devices in which a microstructure having a three dimensional structure which is movable and an electron circuit having a semiconductor element are integrated by semiconductor micromachining technologies. The above microstructure differs from a semiconductor element in having a three-dimensional structure and a movable portion. Further, it may have functions of switches, variable capacitors, actuators, and the like.

Since a micromachine can control microstructures inside itself using electron circuits, unlike a conventional device which is controlled by central processing using a computer, it can be constructed as an autonomous decentralized system. An autonomous decentralized system can perform a series of operations of processing information obtained with a sensor by an electronic circuit and working through an actuator.

There have been many studies on such micromachines (Reference 1: Japanese Patent Laid-open No. 2004-1201). In Reference 1, a thin film mechanical device which is crystallized is disclosed.

SUMMARY OF THE INVENTION

A microstructure and a semiconductor element included in a micromachine are generally manufactured in different steps because a step of etching a sacrificial layer and the like are required for manufacturing the microstructure, so the process of manufacturing a microstructure is different from that of manufacturing a semiconductor element. Further, how to seal the microstructure is a major problem. Since the processes of manufacturing the microstructure and the semiconductor layer in a practically used micromachine are different as described above, they are generally formed in different steps.

However, a method of manufacturing a microstructure and a semiconductor element in one process is desired for achieving reduction in the manufacturing cost and smaller size of the devices. Accordingly, it is an object of the present invention to provide a method for manufacturing a micromachine in which a microstructure and a semiconductor element are formed over one insulating substrate. It is another object of the invention to provide a micromachine manufactured in the above manner.

In order to achieve the objects, the invention is a micromachine having a layer containing polycrystalline silicon which is crystallized by thermal crystallization or laser crystallization using metal (in this specification, also referred to as a structure layer), and having a space (also referred to as a hollow) under or above the layer and a semiconductor device having the micromachine. Such polycrystalline silicon has high strength and can be formed on an insulating surface typified by a glass substrate, so that it can also be used as a microstructure, and naturally, it can also form a semiconductor element. Accordingly, a semiconductor device in which a microstructure and a semiconductor element are formed over one insulating substrate can be formed.

The space may have a single layer structure or a layered structure. Such space is formed by removing a sacrificial layer using an etchant introduced through a contact hole. Therefore, when the semiconductor device is seen in a cross-sectional view, spaces having a layered structure are preferably connected using a contact hole or the like. Further, the spaces are also preferably connected using a contact hole or the like in order to reduce number of steps of removing the sacrificial layer. In other words, spaces may be provided above and below a structure layer (a layer containing polycrystalline silicon) and structure layers are stacked with a space sandwiched therebetween. Spaces which are provided above and below a structure layer in this way are formed by removing sacrificial layers provided above and under the structure layer. Therefore, when the semiconductor device is shown in a cross-sectional view in a certain direction, in the case where a first space is over the substrate, a first structure layer is on the first space, a second space is on the first structure layer, and a second structure layer is on the second space, the first space and the second space are connected in a portion other than the first space and the second space.

With such spaces, the layer containing polycrystalline silicon is made movable. "Movable" means, for example, movable in the sense of being able to move up and down or from side to side, and also includes being able to rotate about an axis. Accordingly, a structure layer (a layer containing polycrystalline silicon) sandwiched between the spaces above and below it can move up and down, from side to side, or rotate about an axis, due to the presence of the spaces.

A specific structure of the present invention will be described below.

One mode of the invention is a semiconductor device comprising an electric circuit and a microstructure over an insulating surface. The electric circuit has a semiconductor element, and the microstructure has a movable layer containing polycrystalline silicon, which is crystallized by thermal crystallization or laser crystallization using metal.

In another mode of the invention, a conductive layer forming a wiring is further provided, so that an electric circuit and a microstructure can be electrically connected through the conductive layer.

In another mode of the invention, a counter substrate which is opposite to an insulating surface is provided, and an insulating layer serving as a protective layer can be provided to a portion of the counter substrate opposite to a portion where a microstructure is not provided.

In another mode of the invention, a conductive layer forming a wiring and a counter substrate opposite to a insulating surface are provided, so that an electric circuit and a microstructure can be electrically connected through the conductive layer, and an insulating layer serving as a protective layer can be provided to a portion of the counter substrate opposite to a portion where a microstructure is not provided.

In another mode of the invention, a first conductive layer forming a first wiring provided over an insulating surface and a counter substrate opposite to the insulating surface are further provided. An insulating layer serving as a protective layer can be provided to a portion of the counter substrate opposite to a portion where a microstructure is not provided, a second conductive layer forming a second wiring is provided over the protective layer, and an electric circuit and a microstructure can be electrically connected through the first conductive layer and the second conductive layer.

The counter substrate can protect a microstructure and an electric circuit. Note that any insulating material such as a protective film can be used to protect the microstructure and the electric circuit without limitation to a substrate, as long as it has a protecting function so as to protect a microstructure and an electric circuit.

In the invention, connection between wirings (conductive layers) and connection between an electric circuit and a microstructure can be established through an anisotropic conductive layer.

In the invention, a space is provided between a movable layer containing polycrystalline silicon and an insulating surface.

In the invention, a first space is provided between a movable layer containing polycrystalline silicon and an insulating surface, and a second space is provided between the movable layer containing polycrystalline silicon and a layer provided over the movable layer containing polycrystalline silicon.

In the invention, a microstructure includes a conductive layer containing a metal element or a metal compound provided over an insulating surface and a movable layer containing polycrystalline silicon provided over the conductive layer, and a space is provided between the conductive layer and the movable layer containing polycrystalline silicon.

In the present invention, a microstructure includes a conductive layer containing a metal element or a metal compound provided over an insulating surface, a movable layer containing polycrystalline silicon provided over the conductive layer, a first space provided between the conductive layer and the movable layer containing polycrystalline silicon, and a second space provided between the movable layer containing polycrystalline silicon and a layer over the movable layer containing polycrystalline silicon.

In the invention, a microstructure includes a movable layer containing polycrystalline silicon provided over an insulating substrate, a conductive layer containing a metal element or a metal compound provided over the movable layer containing polycrystalline silicon, and a space between the movable layer containing polycrystalline silicon and the conductive layer.

In the invention, a microstructure includes a movable layer containing polycrystalline silicon provided over an insulating substrate, a conductive layer containing a metal element or a metal compound provided over the movable layer containing polycrystalline silicon, and an insulating layer containing an organic material or an inorganic material provided over the conductive layer; a first space provided between the movable layer containing polycrystalline silicon and the conductive layer, and a second space provided between the conductive layer and the insulating layer.

In the invention a microstructure includes a movable layer containing polycrystalline silicon provided over an insulating substrate, a conductive layer containing a metal element or a metal compound provided over the movable layer containing polycrystalline silicon, and an insulating layer containing an organic material or an inorganic material provided over the conductive layer; and a space is provided between the movable layer containing polycrystalline silicon and the conductive layer.

A mode of the invention is a method for manufacturing a semiconductor device including forming a layer containing polycrystalline silicon crystallized by using a metal over an insulating surface, forming a conductive layer containing a metal element or a metal compound over the layer containing polycrystalline silicon, forming an insulating layer containing silicon oxide or silicon nitride over the conductive layer, forming a sacrificial layer containing one selected from the group consisting of silicon oxide, silicon nitride, a metal element, and a metal compound over the insulating layer, and removing the sacrificial layer by etching.

Another mode of the invention is a method for manufacturing a semiconductor device including forming a layer containing polycrystalline silicon crystallized by using a metal over an insulating surface, forming a conductive layer containing a metal element or a metal compound over the layer containing polycrystalline silicon, forming a first insulating layer containing silicon oxide or silicon nitride over the conductive layer, forming a sacrificial layer containing one selected from the group consisting of silicon oxide, silicon nitride, a metal element, and a metal compound over the first insulating layer, forming a second insulating layer containing an inorganic material or an organic material over the sacrificial layer, forming contact hole in the second insulating layer, and removing the sacrificial layer by introducing an etchant into the contact hole.

Further, another mode of the invention is a method for manufacturing a semiconductor device including forming a first sacrificial layer containing one selected from the group consisting of silicon oxide, silicon nitride, a metal element, and a metal compound over a substrate; forming a layer containing polycrystalline silicon crystallized by using a metal over the first sacrificial layer; forming a second sacrificial layer containing one selected from the group consisting of silicon, a compound of silicon, a metal element, and a metal compound over the layer containing polycrystalline silicon; forming a first insulating layer over the second sacrificial layer; and removing a part or a whole of the first sacrificial layer and the second sacrificial layer by etching.

Another mode of the invention is a method for manufacturing a semiconductor device including forming a first conductive layer containing a metal element or a metal compound over a substrate; forming a first sacrificial layer containing one selected from the group consisting of silicon oxide, silicon nitride, metal element, and a metal compound over the first conductive layer; forming a layer containing polycrystalline silicon crystallized by using a metal over the sacrificial layer; forming a second sacrificial layer containing one selected from the group consisting of silicon, a compound of silicon, a metal element, and a metal compound over the layer containing polycrystalline silicon; forming a first insulating layer over the second sacrificial layer; and removing a part or a whole of the first sacrificial layer and the second sacrificial layer by etching.

Another mode of the invention is a method for manufacturing a semiconductor device including forming a layer containing polycrystalline silicon crystallized by using a metal in a first and second regions on an insulating surface, forming a conductive layer containing a metal element or a metal compound over the layer containing polycrystalline silicon, forming an insulating layer containing silicon oxide or silicon nitride over the conductive layer, forming a sacrificial layer containing one selected from the group consisting of silicon oxide, silicon nitride, a metal element, and a metal compound over the insulating layer, removing the sacrificial layer formed in the first region by etching, thereby forming a microstructure, and forming a semiconductor element having the layer containing polycrystalline silicon, the conductive layer, and the insulating layer in the second region.

Another mode of the invention is a method for manufacturing a semiconductor device including forming a layer containing polycrystalline silicon crystallized by using a metal in a first and second regions on the insulating surface, forming a first conductive layer containing a metal element or a metal compound over the layer containing polycrystalline silicon, forming an insulating layer containing silicon oxide or silicon nitride over the first conductive layer, forming a sacrificial layer containing one selected from the group consisting of silicon oxide, silicon nitride, a metal element, and a metal compound over the insulating layer, forming a second conductive layer forming a wiring containing a metal element or a metal compound over the sacrificial layer, removing the sacrificial layer formed in the first region by etching, thereby forming a microstructure, forming a semiconductor element having the layer containing polycrystalline silicon, the first conductive layer, and the insulating layer in the second region, and electrically connecting the microstructure and the semiconductor element through the wiring.

Another mode of the invention is a method for manufacturing a semiconductor device including forming a layer containing polycrystalline silicon crystallized by using a metal in a first and second regions on a first insulating surface; forming a conductive layer containing a metal element or a metal compound over the layer containing polycrystalline silicon; forming an insulating layer containing silicon oxide or silicon nitride over the conductive layer; forming a sacrificial layer containing one selected from the group consisting of silicon oxide, silicon nitride, a metal element, and a metal compound over the insulating layer; removing the sacrificial layer formed in the first region by etching, thereby forming a microstructure; forming a semiconductor element having the layer containing polycrystalline silicon, the conductive layer, and the insulating layer in the second region; forming an insulating layer to be a protective layer using one selected from the group consisting of silicon oxide, silicon nitride, an organic material, or an inorganic material in a region which is not opposite to the microstructure over a second insulating surface; and attaching the first insulating surface and the second insulating surface.

Another mode of the invention is a method for manufacturing a semiconductor device including forming a layer containing polycrystalline silicon crystallized by using a metal in a first and second regions on a first insulating surface; forming a conductive layer containing a metal element or a metal compound over the layer containing polycrystalline silicon; forming an insulating layer containing silicon oxide or silicon nitride over the conductive layer; forming a sacrificial layer containing one selected from the group consisting of silicon oxide, silicon nitride, a metal element, and a metal compound over the insulating layer; forming a first wiring containing a metal element or a metal compound over the sacrificial layer; removing the sacrificial layer formed in the first region by etching, thereby forming a microstructure; forming a semiconductor element having the layer containing polycrystalline silicon, the conductive layer, and the insulating layer in the second region; electrically connecting the microstructure and the semiconductor element through the first wiring; forming an insulating layer to be a protective layer using one selected from the group consisting of silicon oxide, silicon nitride, an organic material, and an inorganic material in a region which is not opposite to the microstructure over a second insulating surface; and attaching the first insulating surface and the second insulating surface.

Another mode of the invention is a method for manufacturing a semiconductor device including forming a layer containing polycrystalline silicon crystallized by using a metal in a first and second regions on an insulating surface; forming a conductive layer containing a metal element or a metal compound over the layer containing polycrystalline silicon; forming an insulating layer containing silicon oxide or silicon nitride over the conductive layer; forming a sacrificial layer containing one selected from the group consisting of silicon oxide, silicon nitride, a metal element, and a metal compound over the insulating layer; forming a first wiring containing a metal element or a metal compound over the sacrificial layer; removing the sacrificial layer formed in the first region by etching, thereby forming a microstructure; forming a semiconductor element having the layer containing polycrystalline silicon, the conductive layer, and the insulating layer in the second region; electrically connecting the microstructure and the semiconductor element through the first wiring; forming a protective layer using one selected from the group consisting of silicon oxide, silicon nitride, an organic material, and an inorganic material in a portion which is not opposite to the microstructure over a second insulating surface; forming a second wiring containing a metal element or a metal compound over the protective layer; and attaching the first insulating surface and the second insulating surface, thereby electrically connecting the first wiring and the second wiring.

Another mode of the invention is a method for manufacturing a semiconductor device including forming a first sacrificial layer containing one selected from the group consisting of silicon oxide, silicon nitride, a metal element, and a metal compound in a first region over a substrate; forming a layer containing polycrystalline silicon crystallized by using a metal over the first sacrificial layer formed in the first region and in a second region over the substrate; forming a layer containing one selected from the group consisting of silicon, a compound of silicon, a metal element, and a metal compound over the layer containing polycrystalline silicon formed in the first region and the second region, thereby forming a second sacrificial layer and a first conductive layer; forming a first insulating layer over the second sacrificial layer and the first conductive layer; removing a part or a whole of the first sacrificial layer and the second sacrificial layer in the first region by etching, thereby forming a microstructure; manufacturing a semiconductor element including the layer containing polycrystalline silicon and the first conductive layer in the second region.

Another mode of the invention is a method for manufacturing a semiconductor device including forming a first conductive layer containing a metal element or a metal compound in a first region over a substrate; forming a first sacrificial layer containing one selected from the group consisting of silicon oxide, silicon nitride, a metal element, and a metal compound over the first conductive layer formed in the first region; forming a layer containing polycrystalline silicon crystallized by using a metal over the first sacrificial layer formed in the first region, and in a second region over the substrate; forming a layer containing one selected from the group consisting of silicon, a compound of silicon, a metal element, and a metal compound over the layer containing polycrystalline silicon formed over the first region and the second region, thereby forming a second sacrificial layer and a second conductive layer; forming a first insulating layer over the second sacrificial layer and the second conductive layer; removing a part or a whole of the first sacrificial layer and the second sacrificial layer in the first region by etching, thereby forming a microstructure in the first region; and manufacturing a semiconductor element having the layer containing polycrystalline silicon and the second conductive layer in the second region.

In another mode of the invention, a contact hole is provided in the first insulating layer, a third conductive layer containing a metal element or a metal compound is formed over the first insulating layer and in the contact hole, and a part of or a whole of the first sacrificial layer and the second sacrificial layer in the first region is removed by etching.

Another mode of the invention is a method for manufacturing a semiconductor device including forming a first sacrificial layer containing one selected from the group consisting of silicon oxide, silicon nitride, a metal element, and a metal compound over a substrate; forming a layer containing polycrystalline silicon crystallized by using a metal over the first sacrificial layer; forming a second sacrificial layer containing one selected from the group consisting of silicon, a compound of silicon, a metal element, and a metal compound over the layer containing polycrystalline silicon; forming a first insulating layer over the second sacrificial layer; removing a part or a whole of the first sacrificial layer and the second sacrificial layer by etching; forming a second insulating layer over a counter substrate; and attaching the substrate and the counter substrate so that they are opposite to each other.

Another mode of the invention is a method for manufacturing a semiconductor device including forming a first conductive layer containing a metal element or a metal compound over a substrate; forming a first sacrificial layer containing one selected from the group consisting of silicon oxide, silicon nitride, a metal element, and a metal compound over the first conductive layer; forming a layer containing polycrystalline silicon crystallized by using a metal over the sacrificial layer; forming a second sacrificial layer containing one selected from the group consisting of silicon, a compound of silicon, a metal element, and a metal compound over the layer containing polycrystalline silicon; forming a first insulating layer over the second sacrificial layer; and removing a part or a whole of the first sacrificial layer and the second sacrificial layer by etching; forming a second insulating layer over a counter substrate; and attaching the substrate and the counter substrate so that they are opposite to each other.

Another mode of the invention is a method for manufacturing a semiconductor device including forming a first sacrificial layer containing one selected from the group consisting of silicon oxide, silicon nitride, a metal element, and a metal compound over a substrate; forming a layer containing polycrystalline silicon crystallized by using a metal over the first sacrificial layer formed in the first region, and in a second region over the substrate; forming a layer containing one selected from the group consisting of silicon, a compound of silicon, a metal element, and a metal compound over the layer containing polycrystalline silicon formed in the first region and the second region, thereby forming a second sacrificial layer and a first conductive layer; forming a first insulating layer over the second sacrificial layer and the first conductive layer; removing a part or a whole of the first sacrificial layer and the second sacrificial layer in the first region, thereby manufacturing a microstructure in the first region; manufacturing a semiconductor element having the layer containing polycrystalline silicon and the first conductive layer in the second region; forming a second insulating layer over a counter substrate; and attaching the substrate and the counter substrate so that they are opposite to each other.

Another mode of the invention is a method for manufacturing a semiconductor device including forming a first conductive layer containing a metal element or a metal compound in first region over a substrate; forming a first sacrificial layer containing one selected from the group consisting of silicon oxide, silicon nitride, a metal element, and a metal compound over the first conductive layer formed in the first region; forming a layer containing polycrystalline silicon crystallized by using a metal over the first sacrificial layer formed in the first region, and in a second region over the substrate; forming a layer containing one selected from the group consisting of silicon, a compound of silicon, a metal element, and a metal compound over the layer containing polycrystalline silicon formed in the first region and the second region, thereby forming a second sacrificial layer and a second conductive layer; forming a first insulating layer over the second sacrificial layer and the second conductive layer; removing a part or a whole of the first sacrificial layer and the second sacrificial layer in the first region, thereby manufacturing a microstructure in the first region; manufacturing a semiconductor element having the layer containing polycrystalline silicon and the second conductive layer in the second region; forming a second insulating layer over a counter substrate; and attaching the substrate and the counter substrate so that they are opposite to each other.

Further, another mode of the invention includes providing a contact hole in a first insulating layer; forming a third conductive layer containing a metal element or a metal compound over the first insulating layer and in the contact hole; removing a part or a whole of a first sacrificial layer and a second sacrificial layer in a first region by etching; forming a second insulating layer over a counter substrate; forming a fourth conductive layer containing a metal element or a metal compound over the second insulating layer; and attaching a substrate and the counter substrate using an anisotropic conductive material so that they are opposite to each other, and the third conductive layer and the fourth conductive layer are electrically connected to each other.

Another mode of the invention includes providing a first contact hole in a first insulating layer; forming a third conductive layer containing a metal element or a metal compound over the first insulating layer and in a first contact hole; forming a third insulating layer over the third conductive layer; providing a second contact hole in the third insulating layer; forming a fifth conductive layer containing a metal element or a metal compound over the third insulating layer and in the second contact; removing a part or a whole of the first sacrificial layer and the second sacrificial layer in a first region by etching; and forming a second insulating layer over a counter substrate, forming a fourth conductive layer containing a metal element or a metal compound over the second insulating layer; attaching a substrate and the counter substrate using an anisotropic conductive material so that they are opposite to each other, and the fifth conductive layer and the fourth conductive layer are electrically connected.

In another mode of the invention, the second insulating layer is formed in a portion which is not opposite to a portion where a part or a whole of the first sacrificial layer and the second sacrificial layer is removed by etching.

In another mode of the invention, the substrate is a substrate having an insulating surface.

In another mode of the invention, polycrystalline silicon crystallized by thermal crystallization or laser crystallization using the metal added to a selective region is used for the layer containing polycrystalline silicon.

In another mode of the invention, a stack with layers of amorphous silicon and polycrystalline silicon crystallized by thermal crystallization or laser crystallization using the metal added to a selective region is used for the layer containing polycrystalline silicon.

In another mode of the invention, one or more of Ni, Fe, Ru, Rh, Pd, Pd, Os, Ir, Pt, Cu, and Au is used for the metal for crystallization of polycrystalline silicon.

Note that the first space to the fifth space are named for the sake of convenience. For example, a partially continuous space may be separately referred to as a first space and a second space.

The invention provides a semiconductor device in which a microstructure resistant to external force or stress, and a semiconductor element superior in device characteristics are formed over one substrate by using polycrystalline silicon crystallized using a metal such as nickel (Ni) for a structure layer of the microstructure and an active layer of a semiconductor element. Furthermore, according to the invention, a microstructure and a semiconductor are formed on one substrate; thus, a low-cost semiconductor device which does not require assembly or packaging can be provided.

BRIEF DESCRIPTION OF THE DRAWINGS

In the accompanying drawings:

FIGS. 6A to 6F are figures for explaining a manufacturing method of a semiconductor device of the invention;

DETAILED DESCRIPTION OF THE INVENTION

Figure 1:
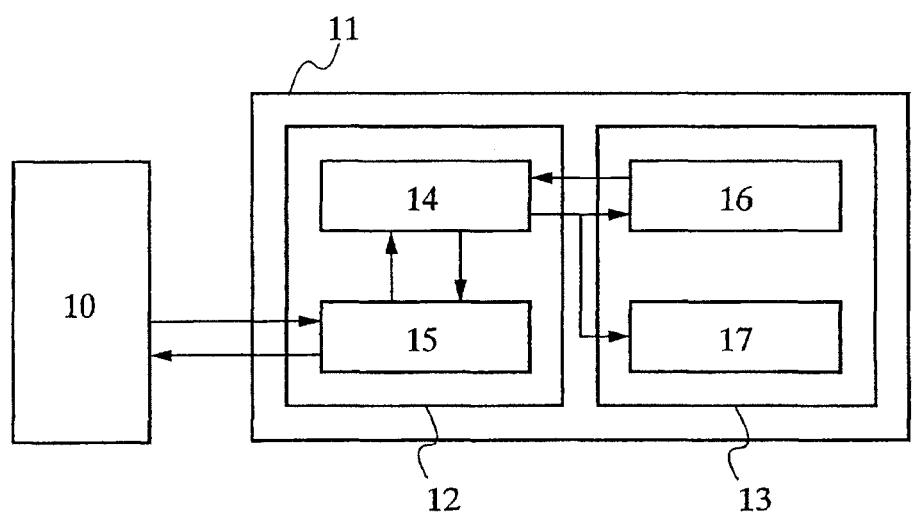
FIG. 1 is a figure for explaining a semiconductor device of the invention.

Embodiment Modes and Embodiment of the present invention will be described below with reference to the drawings. However, the present invention is not limited to the description below because it is easily understood by those skilled in the art that the modes and details can be variously modified without departing from the sprit and scope of the invention. Therefore, the present invention should not be construed as being limited thereto. Incidentally, in the descriptions for explaining the structure of the invention with reference to drawings, the same reference numerals denoting the same parts or parts having the same functions are commonly used among the different drawings.

Embodiment Mode 1

In this embodiment mode, a configuration example of a semiconductor device according to the invention and a method for manufacturing the semiconductor device will be described with reference to drawings.

A semiconductor device of the invention is in the field of micromachines, and the size is in units of micrometer to millimeter. Further, in the case of manufacturing the semiconductor device as a component incorporated in a mechanical apparatus, a semiconductor device may be in units of meter so that it can be handled easily at the time of assembly.

FIG. 1 shows a schematic view of a semiconductor device of the present invention.

A semiconductor device 11 of the invention has an electric circuit portion 12 including a semiconductor element and a structure portion 13 formed from a microstructure. The electric circuit portion 12 has a control circuit 14 for controlling the microstructure, an interface 15 for communicating with an external control device 10, and the like. Further, the structure portion 13 has a sensor 16, an actuator 17, a switch, and the like which are formed from the microstructure.

Further, the electric circuit portion 12 may have a central processing unit (CPU) for processing information obtained by the structure portion 13, a memory for storing the processed information, or the like.

The external control device 10 is a device for the operations of transmitting a signal for controlling the semiconductor device 11, receiving information obtained by the semiconductor device 11, supplying drive power to the semiconductor device 11, or the like.

The present invention is not limited to the above configuration example. Since the invention is a semiconductor device including an electric circuit having a semiconductor element for controlling a microstructure and a microstructure controlled by the electric circuit, structure of other parts is not limited to FIG. 1.

Conventionally, in the case of handling a minute objects having units of a millimeter or smaller, a process has been required in which the structure of the minute object is elongated, humans or a computer obtain its information to determine the processes and operations, and the operations are condensed and transmitted to the minute objects.

The semiconductor device according to the invention which is shown in FIG. 1 can handle a minute object just by humans or a computer giving broader instructions. Specifically, when humans or a computer determine an objective and place an instruction, the semiconductor device can obtain the information about an object using a sensor or the like, process the information, and thereby move.

In the above example, the object is assumed to be minute. Such an object includes, for example, a small signal (for example, a small change in light or pressure) or the like given by the object which itself has a size in meters.

Next, a method for manufacturing a microstructure and a semiconductor element over one substrate for manufacturing a semiconductor device of the present invention described above will be described with reference to FIGS. 2A to 5B. Each of drawings is a top view or a cross-sectional view taken along lines O-P or Q-R in the corresponding top view.

A microstructure and a semiconductor element of the invention can be integrated on a substrate having an insulating surface (hereinafter referred to as an insulating substrate). Here, an insulating substrate is a glass substrate, a quartz substrate, a plastic substrate, or the like. In addition, a substrate such as a conductive substrate formed of metal or the like and a semiconductive substrate formed of silicon or the like on which an insulating layer is formed can be used. When a microstructure and a semiconductor element are integrated on a plastic substrate, a thin semiconductor device having high flexibility can be formed. In addition, a thin semiconductor device can be formed by thinning a glass substrate by polishing or the like.

Figure 2A:
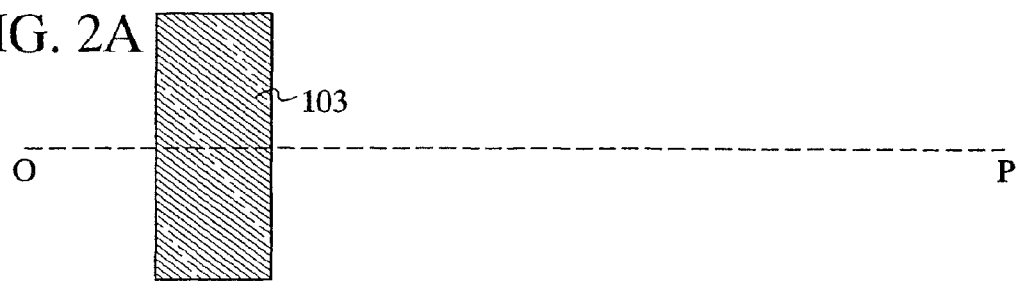
FIGS. 2A to 2F are figures for explaining a manufacturing method of a semiconductor device of the invention.
Figure 2B:
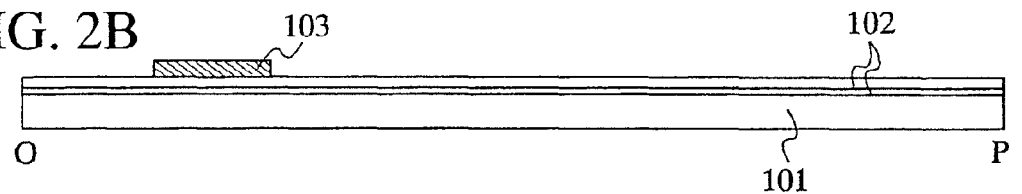

First, a base film 102 is formed over a substrate having an insulating surface 101 (FIGS. 2A and 2B). The base film 102 can be formed from a single layer of an insulating layer such as a silicon oxide film, a silicon nitride film and a silicon oxynitride film or a stack thereof. Here, the case of using a two-layer structure for the base film 102 is described; however, the base film 102 may have a single layer structure of an insulating layer or a structure in which two or more insulating layers are stacked.

As a first layer of the base film 102, a silicon oxynitride film can be formed by plasma CVD using $SiH_4$, $NH_3$, $N_2O$, and $H_2$ as reactive gases with a thickness of 10 nm to 200 nm (preferably 50 nm to 100 nm). In this embodiment mode, a silicon oxynitride film having a film thickness of 50 nm is formed. After that, as a second layer of the base film 102, a silicon oxynitride film can be formed by plasma CVD using $SiH_4$ and $N_2O$ as reactive gases with a thickness of 50 nm to 200 nm (preferably 100 nm to 150 nm) over the first layer. In this embodiment mode, a silicon oxynitride film having a thickness of 100 nm is formed.

Next, a first sacrificial layer 103 is formed over the base film 102 and formed into an arbitrary shape by patterning (FIGS. 2A and 2B). The first sacrificial layer 103 can be formed of a material of an element or a compound of a metal or silicon such as tungsten, silicon nitride, or the like, by sputtering, CVD, or the like. In the patterning, a resist mask is formed by photolithography and anisotropic dry etching is conducted. A sacrificial layer refers to a layer which is to be removed in a later step, and a space is formed by removing the sacrificial layer. Such a sacrificial layer can be formed of material containing a metal element, a metal compound, silicon, silicon oxide, or silicon nitride. Further, the sacrificial layer may be either a conductor or an insulator.

The film thickness of the first sacrificial layer 103 is determined in consideration of various factors such as the material of the first sacrificial layer 103, the structure and the operation method of the microstructure, the method of etching for removing the sacrificial layer, or the like. For example, when the first sacrificial layer 103 is excessively thin, it is not etched because the etchant is not diffused. Further, after etching, buckling or the like may occur in the structure layer. In addition, for example, in the case where a conductive layer is formed under the sacrificial layer and the microstructure is operated by electrostatic force, specifically in the case of operating the microstructure by electrostatic force between the conductive layer and the structure layer, if the first sacrificial layer is excessively thick, there is a risk that it cannot be driven. The first sacrificial layer 103 has a thickness of for example, 0.5 μm or more and 3 μm or less, preferably, 1 μm to 2.5 μm.

Further, in the case where a material having high internal stress is used as a sacrificial layer, a thick sacrificial layer cannot be formed at one time. In this case, the first sacrificial layer may be formed to be thick by repeating the film formation and patterning.

Figure 2C:
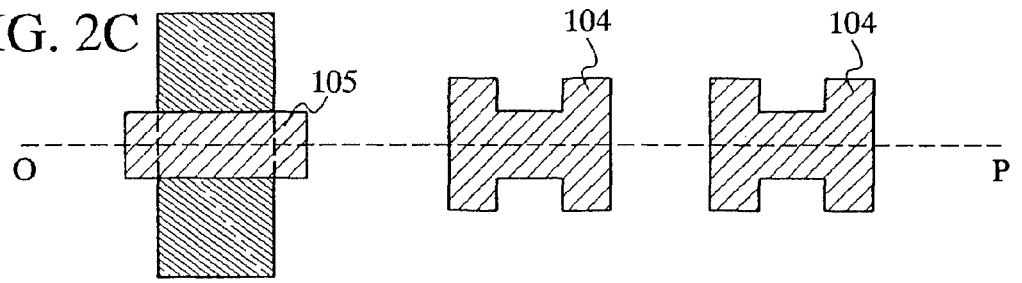
Figure 2D:
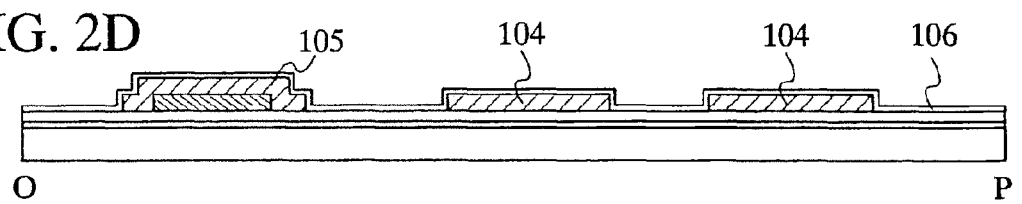

Next, a semiconductor layer which is to be a semiconductor layer 104 forming the semiconductor element and a structure layer 105 forming the microstructure is formed and formed into an arbitrary shape by patterning (FIGS. 2C and 2D). The semiconductor layer (the semiconductor layer 104 and the structure layer 105 are collectively referred to as a semiconductor layer) can be formed of a material containing silicon. The material containing silicon may be a material formed of silicon, a silicon-germanium material containing approximately 0.01 atomic % to 4.5 atomic % of germanium, or the like.

The material and film thickness of the structure layer 105 are determined in consideration of various factors such as the thickness of the first sacrificial layer 103, the material of the structure layer 105, the structure of the microstructure, or the method of etching for removing the sacrificial layer, or the like. For example, when the structure layer 105 is formed thickly, distribution is caused in the internal stress, which becomes a factor of a warps or buckling. Conversely, the structure layer 105 formed using a material having very uneven distribution in internal stress may be used to form the microstructure. Further, when the structure layer 105 is thin, there is a risk that the microstructure may be buckled due to the surface tension of the solution used for etching the sacrificial layer. Therefore, the thickness of the structure layer is set so as not to cause buckling or the like. For example, in the case of manufacturing the structure layer 105 using the semiconductor layer in this embodiment mode, the film thickness is preferably 0.5 μm to 10 μm.

Further, the semiconductor layer may be formed from a material having a crystalline structure, or an amorphous structure. In this embodiment mode, an amorphous semiconductor layer is formed and crystallized by heat treatment to form a crystalline semiconductor layer. A heating furnace, laser irradiation, or irradiation with light from a lamp instead of a laser beam (hereinafter referred to as lamp annealing), or a combination thereof may be used for the heat treatment.

In the case of using laser irradiation, a continuous wave laser beam (a CW laser beam) or a pulsed laser beam can be used. As the laser beam, a beam oscillated from one of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser or a combination thereof may be used. Large grain crystals can be obtained by irradiation with a fundamental wave or one of second to fourth harmonics of such a laser beam. For example, a second harmonic (532 nm) or a third harmonic (355 nm) of an Nd:$YVO_4$ laser (fundamental wave: 1064 nm) can be used. At this time, the laser beam is required to have an energy density of approximately 0.01 $MW/cm^2$ to 100 $MW/cm^2$ (preferably 0.1 $MW/cm^2$ to 10 $MW/cm^2$). Further, the irradiation is conducted at a scanning speed of approximately 10 cm/sec to 2000 cm/sec.

Note that a fundamental wave of a continuous wave laser beam and a harmonic of a continuous wave laser beam may be used for the irradiation. Alternatively, a fundamental wave of a continuous wave laser beam and a harmonic of a pulsed laser beam may be used for the irradiation. By irradiation with a plurality of laser beams, the energy can be supplemented.

Further, a pulsed laser beam oscillated from a laser at a repetition rate such that after a semiconductor layer is melted by the pulsed laser beam, it can be irradiated with the next pulsed laser beam before it is solidified, may be used. A crystal continuously grown in the scan direction can be obtained using a laser beam oscillated at such repetition rate. The specific repetition rate of the laser beam is 10 MHz or more, which is in a significantly higher frequency band than the generally used frequency band of several dozen Hz to several hundred Hz.

As another heating treatment, an amorphous semiconductor layer is heated at 400° C. to 550° C. for 2 to 20 hours in the case of using a heating furnace. In that case, the temperature is preferably set at multiple levels in the range of 400° C. to 550° C. so as to be gradually increased. Since hydrogen or the like in the amorphous semiconductor layer is released by an initial heating process at a low temperature of about 400° C., film roughness due to crystallization can be reduced. Moreover, a metal element which can promote crystallization, for example, nickel is preferably formed on an amorphous semiconductor layer thereby reducing the heating temperature. As the metal element, a metal such as Fe, Ru, Rh, Pd, Os, Ir, Pt, Cu, or Au can be used.

The above-mentioned laser irradiation may be added to the heat treatment to form the crystalline semiconductor layer.

Thus, the crystal structure of the structure layer 105 formed as above can have a nearly single crystal structure. Therefore, the tenacity of the structure layer 105 can be increased. The formed semiconductor layer (in this embodiment mode, formed of silicon) is crystallized by thermal crystallization or laser crystallization using a metal. Accordingly, the structure layer 105 having higher tenacity can be obtained compared with the case of using general polycrystalline silicon for the material of the structure layer. Note that general polycrystalline silicon refers to polycrystalline silicon that is formed by only thermal crystallization without using metal. Thus, the tenacity of the structure layer 105 can be increased because a semiconductor layer having continuous grain boundary can be formed by the crystallization process. The structure layer 105 has a crystalline structure in which covalent bonds are not broken at grain boundaries, unlike amorphous silicon or polycrystalline silicon obtained by conventional thermal crystallization. Accordingly, stress concentration which is caused by defects due to grain boundaries does not occur. As a result, fracture stress is high compared with general polycrystalline silicon.

Further, crystalline silicon formed using a metal has a continuous grain boundary. Accordingly, it is suitable as a material of the structure layer in the case where a microstructure is controlled by electrostatic force when the electron mobility is high.

Furthermore, when crystalline silicon is formed using a metal promoting crystallization, the crystalline silicon can contain the metal. Therefore, a microstructure can be conductive, which is suitable for a semiconductor device in which the microstructure is controlled by electrostatic force.

Since a metal promoting crystallization is a contaminant of a semiconductor device, it may be removed or reduced after the crystallization. In this case, after crystallization by heat treatment or laser irradiation, a layer to be a gettering sink is formed on a semiconductor layer, and heated, thereby moving the metal into the gettering sink; thus, the metal can be removed or reduced. A polycrystalline semiconductor layer or a semiconductor layer added with impurities can be use for the gettering sink. For example, a polycrystalline semiconductor layer added with an inert element such as argon can be formed over the semiconductor layer and can be used as a gettering sink. When an inert element is added, distortion can be generated in the polycrystalline semiconductor layer, and the metal can be efficiently captured using the distortion. Alternatively, the metal can be captured by forming a semiconductor layer added with an element such as phosphorus.

Polycrystalline silicon manufactured through such a process can be used as is for the structure layer 105. Further, when conductivity is required for the structure layer 105, structure layer 105 can be added with an impurity element such as phosphorus, arsenic, or boron so as to be conductive.

The conductive microstructure is suitable for a semiconductor device controlled by electrostatic force.

Further, such polycrystalline silicon is also suitable for the semiconductor layer 104. As described above, polycrystalline silicon of the invention is manufactured to have a continuous grain boundary. Accordingly, the mobility of electrons can be increased, so that the performance of the semiconductor element can be improved.

Next, a first insulating layer 106 covering the top face of structure layer 105 is formed over the semiconductor layer 104 and the structure layer 105 (FIGS. 2C and 2D). The first insulating layer 106 formed over the semiconductor layer 104 serves as a gate insulating layer. The first insulating layer 106 can be formed similarly to the base film 102 by plasma CVD or sputtering using a material containing silicon such as silicon oxide or silicon nitride. In this embodiment mode, a silicon oxynitride film is formed with a thickness of 115 nm (composition ratio: Si=32%, O=59%, N=7%, and H=2%) by plasma CVD as the first insulating layer 106. Naturally, the first insulating layer 106 is not limited to a silicon oxynitride film, and another insulating layer containing silicon may be used in a single layer or a layered structure.

Further, as a material of the first insulating layer 106, a metal oxide having high dielectric constant, for example, hafnium (Hf) oxide can be used. When such a high dielectric constant material is applied to the gate insulating layer, the semiconductor element can be driven at low voltage; thus, a low power consumption semiconductor device can be obtained.

Further, the first insulating layer 106 can be formed by high density plasma treatment. The high density plasma treatment is a plasma treatment in which the plasma density is $1 \times 10^{11}$ cm$^{-3}$ or more, preferably $1 \times 10^{11}$ cm$^{-3}$ to $9 \times 10^{15}$ cm$^{-3}$ and a high frequency such as a microwave (for example, frequency: 2.45 GHz) is used. When plasma is produced under such conditions, the low electron temperature is 0.2 eV to 2 eV. Thus, by high density plasma, the feature of which is low electron temperature, a film can be formed with low plasma damage and few defects because the kinetic energy of the active species is low.

A substrate formed with the semiconductor layer 104 and the structure layer 105 is set in a film formation chamber capable of such plasma treatment, and distance between an electrode for generating plasma, which is an antenna, and a target is set 20 mm to 80 mm apart, preferably 20 mm to 60 mm, then film formation process is carried out. Such high density plasma treatment can make a low temperature process (substrate temperature: 400° C. or less) possible. Accordingly, glass or plastics having low thermostability can be used as the substrate 101.

The film formation atmosphere of such an insulating layer may be a nitrogen atmosphere, or an oxygen atmosphere. The nitrogen atmosphere is typically a mixed atmosphere of nitrogen and rare gas, or a mixed atmosphere of nitrogen, hydrogen, and rare gas. At least one of helium, neon, argon, krypton, and xenon can be used as the rare gas. Further, the oxygen atmosphere is typically a mixed atmosphere of oxygen and rare gas; a mixed atmosphere of oxygen, hydrogen, and rare gas; or a mixed atmosphere of dinitrogen monoxide and rare gas. At least one of helium, neon, argon, krypton, and xenon can be used as the rare gas.

An insulating layer formed as described above is dense and causes little damage to other films when forming the first insulating layer 106. Further, an insulating layer formed by high density plasma treatment can improve the state of an interface between the insulating layer and a layer to be in contact therewith. For example, when the first insulating layer 106 is formed by high density plasma treatment, a state of an interface with a semiconductor layer can be improved. Accordingly, electrical properties of the semiconductor element can be improved. In addition, when the insulating layer is formed over a structure layer, damage to the microstructure can be reduced, and strength of the structure layer 105 can be maintained.

Here, the case of using high density plasma treatment for forming the first insulating layer 106 is described; however, the semiconductor layer may also be subjected to high density plasma treatment. The surface of the semiconductor layer can be reformed by the high density plasma treatment, so that the state of an interface can be improved and the electrical properties of the semiconductor element can be improved.

In addition, high density plasma treatment can be used for forming the base film 102 and other insulating layers in addition to the first insulating layer 106.

Figure 2E:
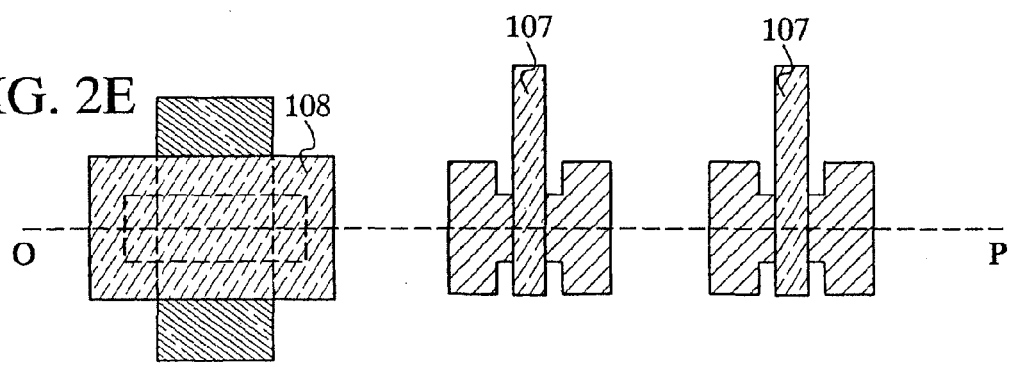
Figure 2F:
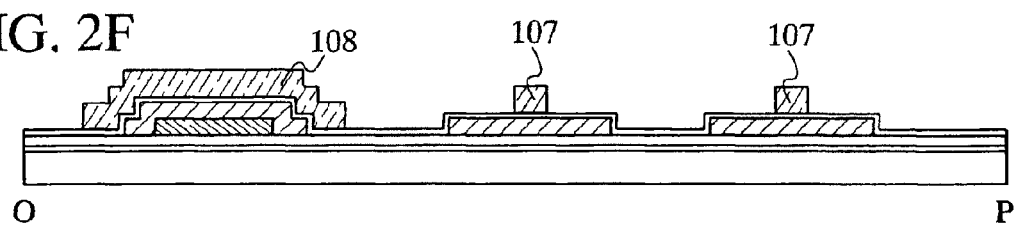

Next, a first conductive layer to be a gate electrode 107 forming a semiconductor element and a second sacrificial layer 108 forming a microstructure is formed over the first insulating layer 106, and formed into arbitrary shapes by patterning (FIGS. 2E and 2F). The first conductive layer (the gate electrode 107 and the second sacrificial layer 108 are collectively referred to as the first conductive layer) can be formed with a conductive metal or compound such as tungsten as a material by sputtering, CVD, or the like.

The first conductive layer is to be a second sacrificial layer 108. In the case of simultaneously etching the second sacrificial layer 108 and the first sacrificial layer 103, it is desirable that the second sacrificial layer 108 is formed of the same material as the first sacrificial layer 103, for example, tungsten or the like. However, the present invention is not limited to these materials, and the first sacrificial layer 103 and the second sacrificial layer 108 may be manufactured using different materials.

The first conductive layer is to be the gate electrode 107 of the semiconductor element. The first conductive layer may be formed to have a stack of layers containing materials of different conductivity and etched into a tapered shape, thereby forming the gate electrode 107. FIGS. 2E and 2F show an example of manufacturing a gate electrode using a single layer structure.

For the patterning, a resist mask is formed by photolithography and anisotropically etched by dry etching. As an example of etching, ICP (Inductively Coupled Plasma) etching can be used. Hereupon, etching conditions (the amount of power applied to a coil electrode, the amount of power applied to an electrode on the substrate 101 side, the temperature of the electrode on the substrate 101 side, and the like) are determined. As an etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used as appropriate.

Figure 3A:
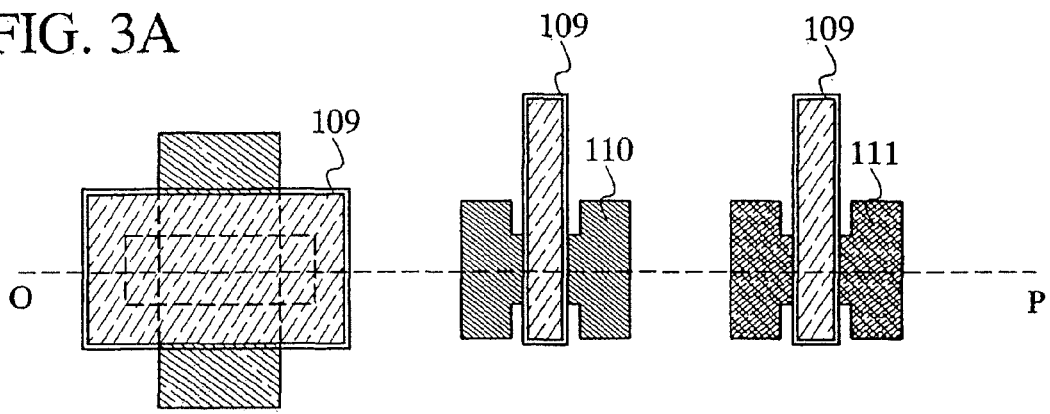
FIGS. 3A to 3D are figures for explaining a manufacturing method of a semiconductor device of the invention.
Figure 3B:
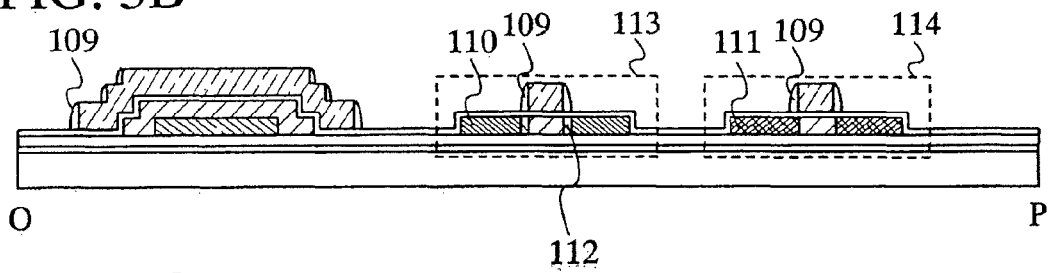

Next, a semiconductor layer 104 forming a semiconductor element is added with an impurity element to form an n-type impurity region 112 and a p-type impurity region 111 (FIGS. 3A and 3B). Such impurity regions can be selectively formed by forming a resist mask by photolithography and adding impurity elements. The impurity element is added by ion doping or ion implantation. As an impurity element which imparts n-type conductivity, phosphorus (P) or arsenic (As) is typically used, and as an impurity element which imparts p-type conductivity, boron (B) can be used. It is desirable that the n-type impurity region 112 and the p-type impurity region 111 are added with an impurity element which imparts n-type conductivity in a concentration range of $1\times10^{20}$ to $1\times10^{21}/cm^3$.

Subsequently, an insulating layer of a nitrogen compound such as silicon nitride or an oxide such as silicon oxide is formed by plasma CVD, and the insulating layer is anisotropically etched in a perpendicular direction, thereby forming an insulating layer in contact with side faces of the gate electrode 107 and the second sacrificial layer 108 (hereinafter referred to as a sidewall 109) (FIGS. 3A and 3B). Short channel effects caused by decrease in the gate length can be prevented by using the sidewall 109.

Next, the semiconductor layer 104 having the n-type impurity region 112 is added with an impurity element so as to form a high concentration n-type impurity region 110 having a higher impurity concentration than the n-type impurity region 112 provided under the sidewall 109.

Further, in the case where the gate electrode 107 is manufactured to have a tapered shape with a stack of layers having materials of different conductivity, the sidewall 109 is not necessarily formed. This is because in the case of using a gate electrode manufactured to have a tapered shape, the n-type impurity region 112 and the high concentration n-type impurity region 110 can be formed at one time when an impurity element is added.

After the impurity region is formed, heat treatment, infrared light irradiation, or laser irradiation is carried out to activate the impurity element. Furthermore, at the same time as the activation, plasma damage to the first insulating layer 106 or the interface between the first insulating layer 106 and the semiconductor layer 104 can be repaired. Effective activation can be carried out particularly when the impurity element is activated using an excimer laser from the surface or from the back in an atmosphere under room temperature to 300° C. Further, a second harmonic of YAG laser may be used for the activation. The irradiation using the YAG laser is preferable because the YAG laser requires less maintenance.

Further, a passivation film of an insulating layer such as a silicon oxynitride film or a silicon oxide film may be formed to cover a conductive layer to be the gate electrode 107 and the semiconductor layer 104. After that, it is possible to carry out heat treatment, infrared light irradiation, or laser irradiation to conduct hydrogenation. For example, a silicon oxynitride film is formed with a thickness of 100 nm by plasma CVD, and then heated using a clean oven at 300° C. to 550° C. for 1 to 12 hours, thereby hydrogenating the semiconductor layer 104. For example, heating is carried out using a clean oven in a nitrogen atmosphere at 410° C. for one hour. Through this process, dangling bonds in the semiconductor layer 104 which are generated when the impurity element is added can be terminated by hydrogen contained in the passivation film. Further, the activation treatment of the impurity region can be carried out simultaneously.

Through the above steps, an n-type semiconductor element 113 and a p-type semiconductor element 114 are formed (FIGS. 3A and 3B).

Figure 3C:
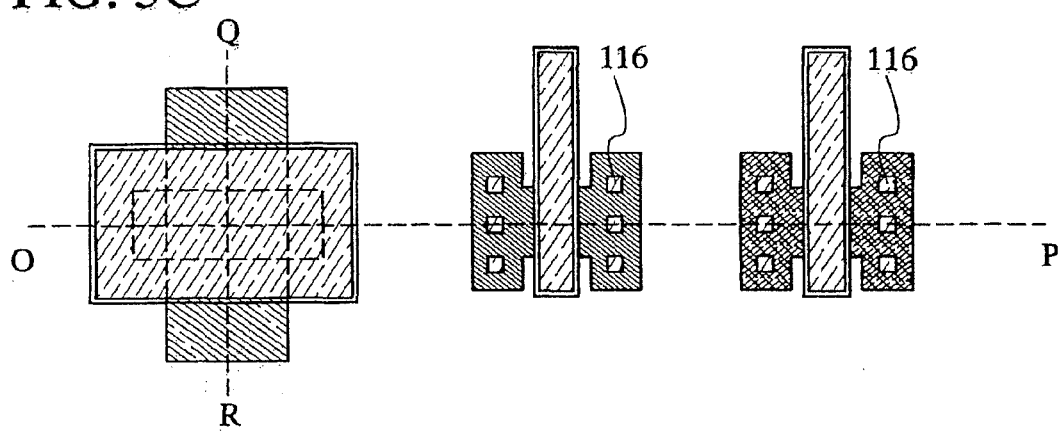
Figure 3D:
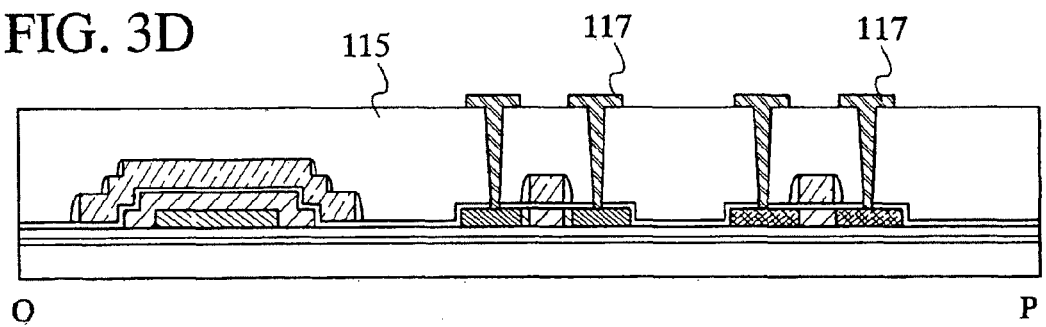

Subsequently, a second insulating layer 115 is formed to cover overall (FIGS. 3C and 3D). The second insulating layer 115 can be formed of an inorganic material or an organic material, or the like, which has insulating properties.

Silicon oxide or silicon nitride can be used for the inorganic material. Polyimide, acrylic, polyamide, polyimide amide, a resist, benzocyclobutene, siloxane, or polysilazane can be used as the organic material. Note that the siloxane resin refers to resin having a bond of Si—O—Si. The skeletal structure of siloxane is formed from a bond of silicon (Si) and oxygen (O). An organic group (for example, an alkyl group or aromatic hydrocarbon) containing at least hydrogen is used as the substituent. A fluoro group may also be used as the substituent. Alternatively, an organic group at least containing hydrogen and a fluoro group may be used as the substituent. Polysilazane is formed using a polymer material having a bond of silicon (Si) and nitrogen (N) as a starting material.

Next, the second insulating layer 115 and the first insulating layer 106 are sequentially etched to form a first contact hole 116 (FIGS. 3C and 3D). Either dry etching or wet etching can be used for carrying out the etching steps. In this embodiment mode, the first contact hole 116 is formed by dry etching.

Next, a second conductive layer 117 is formed on a second insulating layer 115 and in the first contact hole 116, and formed into an arbitrary shape by patterning, thereby forming wirings forming a source electrode, a drain electrode, and an electric circuit (FIGS. 3C and 3D). A film formed of an element such as aluminum (Al), titanium (Ti), molybdenum (Mo), tungsten (W), and silicon (Si), or an alloy film containing any of the above-mentioned elements, can be used for the second conductive layer 117.

Further, when the second conductive layer 117 forms as a rectangle and has corners due to limitations of the layout, the corners are preferably patterned so as to be rounded. By patterning them into a round shape, dust generation is suppressed, and yield is improved. This also applies to the case of patterning a conductive layer such as a gate electrode. Further, when the semiconductor layer is patterned, it is preferable that the corners are rounded.

Figure 4A:
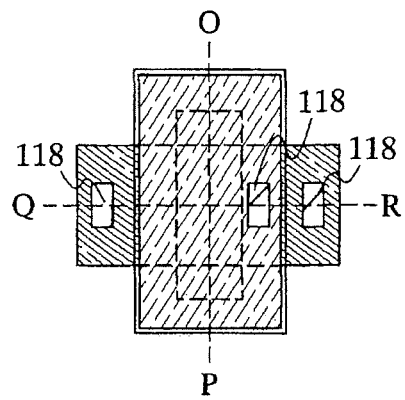
FIGS. 4A to 4E are figures for explaining a manufacturing method of a semiconductor device of the invention.
Figure 4B:
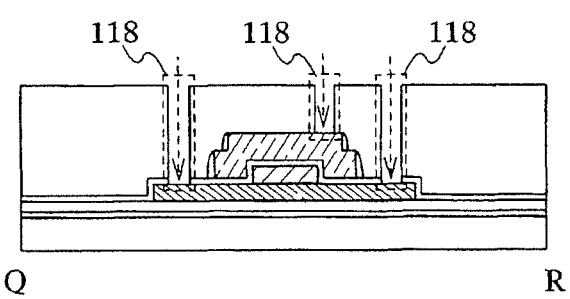

Next, the second insulating layer 115 and the first insulating layer 106 are sequentially etched to form a second contact hole 118, thereby exposing the first sacrificial layer 103, and the second sacrificial layer 108 (FIGS. 4A and 4B). FIGS. 4A and 4B each show only a microstructure. Either dry etching or wet etching can be used for carrying out the etching steps. In this embodiment mode, the second contact hole 118 is formed by dry etching. The second contact hole 118 is formed, so that the first sacrificial layer 103 and the second sacrificial layer 108 are etched away. Therefore, it is necessary to set the diameter so as to have the etchant able to flow in. For example, the diameter of the second contact hole 118 is preferably 2 μm or more.

Further, the second contact hole 118 may be formed to have a diameter such that the first sacrificial layer 103 and the second sacrificial layer 108 can easily be etched. Accordingly, the contact hole is not necessarily formed as a hole which is small as described above, and the second contact hole 118 may be formed so as to expose the whole sacrificial layers, with the necessary portions of the second insulating layer 115 over the semiconductor element and the like left. As a result, the time spent removing the sacrificial layers can be reduced.

Figure 4C:
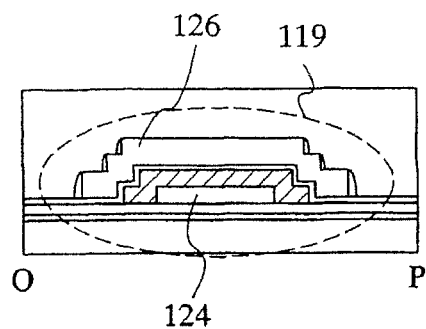
Figure 4D:
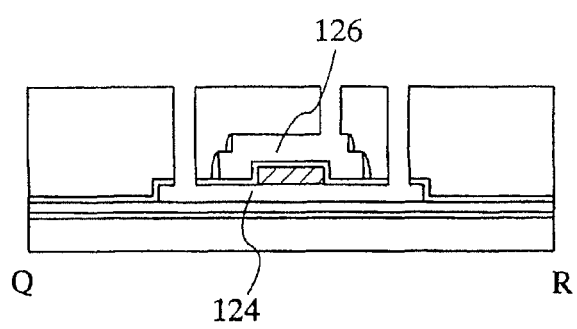

Next, the first sacrificial layer 103 and the second sacrificial layer 108 are etched away through the second contact hole 118 (FIGS. 4C and 4D). Through the etching steps, a first space 124 is created in the portion corresponding to the first sacrificial layer, and a second space 126 is created in the portion corresponding to the second sacrificial layer. Wet etching or dry etching can be carried out as the etching as appropriate, depending on the material of the sacrificial layers.

For example, when the sacrificial layer is formed of tungsten (W), the sacrificial layer can be removed by soaking it for about twenty minutes in a solution in which 28% of ammonia and 31% of oxygenated water are mixed at a ratio of 1:2. In the case where the sacrificial layer is formed of silicon dioxide, buffered hydrofluoric acid in which 49% hydrofluoric acid solution is mixed with ammonium fluoride at a ratio of 1:7 can be used to remove the sacrificial layer. In the case where the sacrificial layer is formed of silicon, phosphoric acid; a hydroxide of an alkali metal such as KOH, NaOH, or CsOH NH$_4$OH; hydrazine; EPD (a mixture of ethylenediamine, pyrocatechol, and water), a solution of TMAH, IPA, or NMD3; or the like can be used.

In drying after wet etching, rinsing is carried out using a low viscosity organic solvent (for example, cyclohexane); drying is carried out under conditions of low temperature and low pressure; or both of the rinsing and drying described above can be combined; thus, the microstructure can be prevented from buckling due to capillary action.

If the first sacrificial layer 103 and the second sacrificial layer 108 are formed of different materials and they cannot be etched with one etchant, the sacrificial layers are separately etched in different steps. In this case, it is necessary to determine the etching conditions with due consideration to the selectivities with the structure layer 105, the second insulating layer 115 and the like, which are in contact with the etchant.

Further, the sacrificial layers can be removed by dry etching using F$_2$ or XeF$_2$ under a condition of high pressure such as atmospheric pressure.

In addition, in order to prevent the microstructure from buckling due to capillary action caused in a space formed by removing a sacrificial layer, the surface of the microstructure may be treated with plasma so as to be water repellent.

When the first sacrificial layer 103 and the second sacrificial layer 108 are etched away through such steps, a space is created and a microstructure 119 can be manufactured.

Figure 4E:
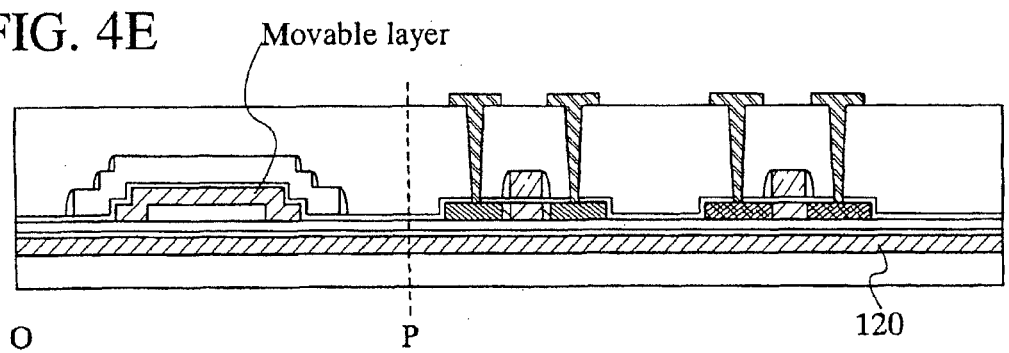

Further, in the case where the microstructure 119 is moved by electrostatic force, a third conductive layer 120 which can be used as a common electrode, a control electrode, or the like is preferably formed under the base film 102 (FIG. 4E). Further, in the case where the base film 102 has a layered structure, the third conductive layer 120 can be formed between layers of the base film 102. The third conductive layer 120 is formed by CVD or the like using a material of a metal such as tungsten or a conductive material as the material. Further, it may be formed into a desired shape by patterning as necessary.

In the above process, the semiconductor layer to be the semiconductor layer 104 and the structure layer 105 is formed over the first sacrificial layer 103; however, it is also possible to form an insulating layer over the first sacrificial layer 103, and then form the semiconductor layer. By using such a process, the structure layer 105 can be protected with the insulating layer when the first sacrificial layer 103 is removed, so that damage to the structure layer 105 can be reduced.

In the method of manufacturing the microstructure 119 described above, it is necessary to select the material of the structure layer 105, the material of the first sacrificial layer 103, the material of the second sacrificial layer 108, and an etchant for removing the sacrificial layers. For example, in the case of using a certain etchant, the first sacrificial layer 103 and the second sacrificial layer 108 may be formed using a material having a higher etching rate than that of the material of the structure layer 105.

Further, the semiconductor layer forming the structure layer 105 may be formed by stacking a layer containing polycrystalline silicon crystallized by the above steps and a layer containing amorphous silicon to have two or more layers. By stacking the semiconductor layers, the structure layer 105 having both suppleness and hardness can be obtained. Further, the suppleness and hardness can be balanced in accordance with the ratio of the thicknesses of the layers to be stacked.

Further, an alloy of silicon such as nickel silicide is generally known to have high strength. If a metal used in crystallizing the semiconductor layer is wholly or selectively left in the semiconductor layer and suitable heat treatment is carried out, a harder microstructure with higher conductivity can be manufactured.

Further, when a layer which is formed of a metal left after the above crystallization and a layer containing polycrystalline silicon are stacked, a supple structure layer having high conductivity can be obtained. In addition, when a layer containing amorphous silicon and a layer containing silicide are stacked, a hard structure layer with superior conductivity can be obtained.

In the case where a metal is added to the entire surface and laser irradiation or heat treatment is performed, silicon grows in a direction perpendicular to the substrate. In the case where a metal is selectively added and laser irradiation or heat treatment is performed, or where the crystallization is performed without using a metal, the crystal grows in a direction parallel to the substrate. When two or more layers having different crystal directions are stacked, a material having even higher tenacity can be obtained. Since films having different crystal directions are stacked, even when one layer is broken, a crack does not easily spread in a layer having a different crystal direction. As a result, a structure layer 105 having high strength, which is not easily broken can be manufactured.

A layer containing amorphous silicon, a layer containing polycrystalline silicon, or a layer containing nickel suicide as described above may be used in a layered structure formed by repeating film formations, thereby obtaining a required thickness. For example, by repeating the film formation of a layer containing amorphous silicon and heating thereof, layers containing polycrystalline silicon can be stacked. Further, in order to further alleviate stress inside the film, after each film formation step, patterning may be added to the film formation to be repeated.

Figure 5A:
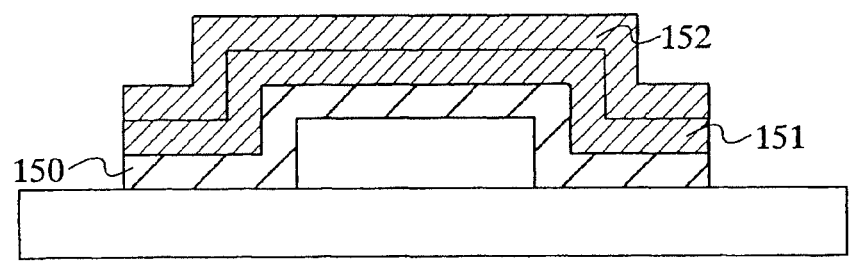
FIGS. 5A and 5B are figures for explaining a manufacturing method of a semiconductor device of the invention.

For example, as shown in FIG. 5A, silicon and compounds of silicon which have different properties can be stacked to form a microstructure. FIG. 5A shows the case of stacking a layer containing amorphous silicon 150, a layer containing polycrystalline silicon 151, and a layer containing nickel silicide 152 over the substrate 101. In accordance with the invention, layers forming a microstructure can be arbitrarily selected and stacked. Further, the above stacking process can easily be conducted. Accordingly, a structure layer 105 having desired properties can be formed easily.

In addition, in the crystallization using metal as in the above process, crystallization can be partially conducted by selective metal coating. For example, when only a portion of the structure layer 105 which overlaps with the first sacrificial layer 103 is coated with metal, the crystallization can be partially conducted.

Figure 5B:
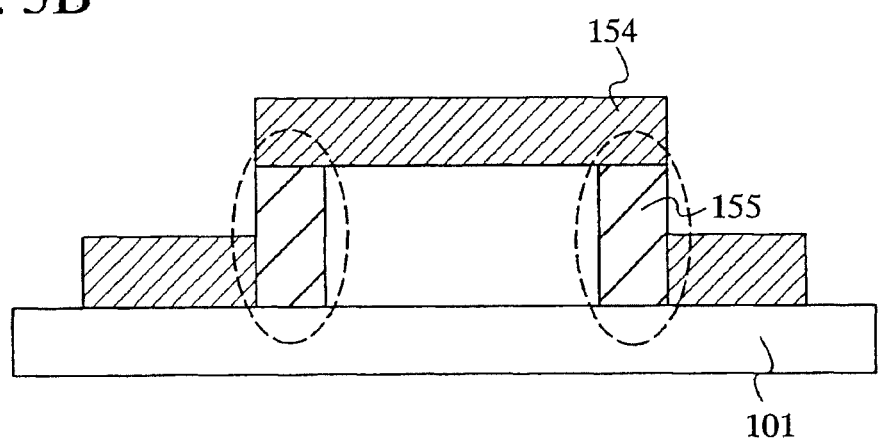

As for crystallization described above, partial crystallization can be conducted by selective laser irradiation. For example, when only a portion of the structure layer 105 which is overlaps with the first sacrificial layer 103 is irradiated with a laser beam, or the conditions of the laser irradiation to be used are changed; amorphous silicon is left in a column part 155 (the portion encircled by a dotted line in the figure) of the structure layer having a beam structure, and only a beam part 154 of the structure layer and a portion of the structure layer which is in contact with the substrate can be crystallized, as shown in FIG. 5B.

By partial crystallization as described above, different combinations of materials can be obtained. For example, only a part of the structure layer to be driven may be crystallized to increase the tenacity.

Note that, the combination of the film formation of the structure layer and the sacrificial layer and the crystallization can be freely selected in accordance with any one of the examples described above. Accordingly, a supple and hard structure layer 105 can be formed.

As in the above process, since crystallization by laser crystallization or laser crystallization using a metal can be conducted at a lower temperature than crystallization using only heat, a wider variety of materials can be used for the process. For example, in a case where the semiconductor layer is crystallized only by heat, heating at a temperature of about 1000° C. for about one hour is required, so that a glass substrate sensitive to heat or a metal whose melting point is 1000° C. or less cannot be used for a substrate. However, in the above process using a metal element, a glass substrate having a strain point of 593° C. or the like can be used.

Further, compared with a semiconductor layer formed only by thermal crystallization, a semiconductor layer formed through the above process has a continuous grain boundary and covalent bonds therein are not broken. Therefore, stress concentration due to defects of dangling bonds between grain boundaries does not occur, and consequently fracture stress is increased as compared with general polycrystalline silicon.

Amorphous silicon has low tenacity but is not easily deformed plastically. In other words, it is hard but vulnerable like glass. In the present invention, due to laser crystallization, amorphous silicon and polycrystalline silicon can be formed in different parts of the substrate 101. Accordingly, a microstructure 119 in which polycrystalline silicon superior in tenacity, which has a continuous grain boundary, and amorphous silicon which is not easily deformed plastically are combined can be manufactured.

Further, generally, internal residual stress exists in amorphous silicon after it is formed into a film. Therefore, when amorphous silicon is formed into a thick film or formed into stacked layers, peel-off is often caused. However, in polycrystalline silicon manufactured using the above process, the internal stress is reduced and polycrystalline silicon can be easily formed into a film through a low-temperature process. Accordingly, polycrystalline silicon can be formed into stacked layers by repeating film formation and crystallization, so that a semiconductor layer having an arbitrary thickness can be obtained. Further, a layer may be formed of another material over the semiconductor layer by patterning, and another semiconductor layer can be formed over the layer.

An alloy of silicon such as nickel silicide is generally known to have high strength. When nickel used as a catalyst is selectively left in the semiconductor layer, and suitable heat treatment is conducted, a harder microstructure 119 having high conductivity can be manufactured. Thus, the thickness of the structure layer 105 can be reduced and a microstructure 119 with high operation speed and high reactivity can be provided.

Further, the invention can provide a semiconductor device which does not require assembly or packaging at low cost by manufacturing a microstructure and a semiconductor element on one substrate.

Embodiment Mode 2

Next, a method for manufacturing a microstructure and a semiconductor element on one substrate in order to manufacture a semiconductor device of the invention described above, which is different from Embodiment Mode 1 will be described with reference to FIGS. 6A to 11C. Each of the drawings is a top view or a cross-sectional view taken along O-P or Q-R in the corresponding top view.

A microstructure and a semiconductor element of the invention can be manufactured on an insulating substrate.

First, a base film 202 is formed over a substrate having an insulating surface 201 (FIGS. 6A and 6B). The base film 202 can be formed from a single layer of an insulating layer such as a silicon oxide film, a silicon nitride film, or a silicon oxynitride film or a stack thereof. Here, the case of using a two-layer structure as in Embodiment Mode 1 for the base film 202 is described; however, the base film 202 may have a single layer structure of an insulating layer or a layered structure including two or more layers of insulating layers.

Next, a semiconductor layer 204 forming a semiconductor element and a semiconductor layer 203 forming a microstructure are formed, and formed into a desired shape by patterning (FIGS. 6A and 6B). The semiconductor layers 203 and 204 may be formed of similar materials to Embodiment Mode 1 and may have a similar structure to Embodiment Mode 1. Further, as in Embodiment Mode 1, a crystalline semiconductor layer can be manufactured by heat treatment using a metal.

Since a semiconductor layer containing a metal used for the crystallization has superior conductivity, the metal may be left in the semiconductor layer 203 forming a microstructure and the metal can be selectively removed only from the semiconductor layer 204 forming a semiconductor element. Further, in the case of removing the metal contained in the semiconductor layer 203 forming a microstructure, the portion of the semiconductor layer 203 forming a microstructure can be used without being doped with an impurity element. In driving the microstructure, when the semiconductor layer 203 is required to be conductive, it can be doped with impurities imparting p-type or n-type conductivity. The impurity doping can be simultaneously carried out with the impurity doping for forming an impurity region of the semiconductor element. The semiconductor layer 203 provided with conductivity by the process is suitable for the structure of a microstructure controlled by electrostatic force.

Next, a first insulating layer 205 is formed over the semiconductor layers 203 and 204 (FIGS. 6A and 6B). The first insulating layer 205 can be formed of a similar material to Embodiment Mode 1 and by a similar method to Embodiment Mode 1. The first insulating layer 205 formed in a region of the semiconductor element servers as a gate insulating layer.

Further, the first insulating layer 205 can be formed by high density plasma treatment, and the conditions or the like are similar to Embodiment Mode 1.

The case of forming the first insulating layer 205 by high density plasma treatment is described here; however, the semiconductor layers 203 and 204 may be treated by high density plasma treatment. The surfaces of semiconductor layers can be modified by high density plasma treatment. As a result, the interface state can be improved and electrical properties of the semiconductor element and the microstructure can be improved. In addition, high density plasma treatment can be used not only for forming the first insulating layer 205 but also for forming the base film 202 or other insulating layers.

Subsequently, a first sacrificial layer 206 is formed over the semiconductor layer 203 forming a microstructure and formed into a desired shape by patterning (FIGS. 6C and 6D). The first sacrificial layer 206 is formed of a material of an element or a compound of a metal or silicon such as tungsten, silicon nitride, or the like by sputtering, CVD, or the like. As the patterning, a mask is formed using a resist by photolithography and anisotropically etched by dry etching.

The film thickness of the first sacrificial layer 206 is determined in consideration of various factors such as the material of the first sacrificial layer 206, the structure and the operation method of the microstructure, the method of etching for removing the sacrificial layer. For example, if the thickness of the first sacrificial layer 206 is excessively thin, the etchant does not diffuse so that the first sacrificial layer 206 cannot be etched, and otherwise buckling is caused in the structure layer after etching. Further, if the first sacrificial layer is excessively thick in the case of operation the microstructure by electrostatic force between the structure layer and a conductive layer under the sacrificial layer, there is a risk that it cannot be driven. The first sacrificial layer 103 has a thickness of 0.5 μm to 3 μm, and preferably has a thickness of 1 μm to 2.5 μm.

Next, conductive layers to be a gate electrode 209 of the semiconductor element, and a structure layer 207 and a second sacrificial layer 208 of the microstructure are formed over the first sacrificial layer 206 and the first insulating layer 205 and formed into a desired shape by patterning (FIGS. 6E and 6F). The conductive layer can be formed of a conductive metal or compound or the like such as tungsten by sputtering, CVD, or the like in order. In this embodiment mode, a structure in which conductive layers are stacked is used. The stacked conductive layers may be formed of either one material or different materials.

The structure layer 207 of the microstructure and a first conductive layer 210 forming the gate electrode 209 of the semiconductor element are formed. The conductive layer may be formed of an element selected from Ta, W, Ti, Mo, Al, or Cu, or an alloy material or a compound material containing the element as a main component with a thickness of about 50 nm to 2 μm. A second conductive layer 211 to be the second sacrificial layer 208 of the microstructure and the gate electrode 209 of the semiconductor element are formed thereover. The conductive layer may be formed of an element selected from Ta, W, Ti, Mo, Al, or Cu, or an alloy material or a compound material containing the element as a main component with a thickness of about 100 nm to 2 μm. Further, a semiconductor layer typified by a polycrystalline silicon film doped with an impurity element such as phosphorus, or an AgPdCu alloy may be used for the first conductive layer and the second conductive layer.

The above conductive layers are not limited to a two-layer structure, and it may have a three-layer structure. For example, a three-layer structure using tungsten, tungsten nitride, or the like for a first layer, an alloy of aluminum and silicon (Al—Si), an alloy of aluminum and titanium (Al—Ti) for a second layer, and a titanium nitride film, a titanium film, or the like for a third layer in order may be used. In this case, the first layer and the second layer are used as the structure layer of the microstructure, and the third layer can be used as the second sacrificial layer. Alternatively, the first layer may be used as the structure layer, and the second layer and the third layer may be used as the second sacrificial layer. Naturally, the conductive layer may have a single layer structure.

Thereafter, patterning is conducted through the following steps to form the structure layer 207, the second sacrificial layer 208, and the gate electrode 209. First, a resist mask is formed into a shape for etching. Next, the second sacrificial layer 208 and the second gate electrode layer 211 are etched by ICP (Inductively Coupled Plasma) etching. Hereupon, they may be patterned to have vertical cross sections by anisotropic etching or may be etched into a tapered shape. Subsequently, etching conditions such as the amount of power applied to a coil electrode, the amount of power applied to an electrode on the substrate side, the temperature of the electrode on the substrate side are determined, so as to etch the structure layer 207 and the first conductive layer 210 into a desired tapered shape. A chlorine-based gas typified by $Cl_2$, $BCl_3$, $SiCl_4$, or $CCl_4$, a fluorine-based gas typified by $CF_4$, $SF_6$ $NF_3$, or the like, or $O_2$ can be used as the etching gas.

In etching the sacrificial layer for manufacturing a microstructure, the second sacrificial layer 208 and the first sacrificial layer 206 are preferably etched simultaneously etching, thereby reducing the number of steps. Accordingly, the second sacrificial layer 208 is desirably formed of the same material as the first sacrificial layer 206. However, the present invention is not limited to the material, and the first sacrificial layer 206 and the second sacrificial layer 208 may be formed of one material or different materials.

Next, the semiconductor layer 204 forming a semiconductor element is doped with an impurity element to form an n-type impurity region and a p-type impurity region. Such impurity regions can be selectively formed by forming a resist mask by photolithography and conducting doping to add an impurity element. The doping with an impurity element can be conducted by a method of ion doping or ion implantation. As an impurity element which imparts n-type conductivity, phosphorus (P) or arsenic (As) is typically used, and boron (B) can be used as an impurity element which imparts p-type conductivity. The impurity element which imparts n-type conductivity is desirably added to the n-type impurity region and the p-type impurity region in a concentration range of $1\times10^{20}$ to $1\times10^{21}/cm^3$. The impurity concentration of the semiconductor layer can be controlled by alternately repeating etching and doping of the gate electrode 209 as necessary to form a high concentration impurity region and a low concentration impurity region.

Further, in the case where the gate electrode 209 is formed from a conductive layer having a single layer or in the case where the gate electrode 209 is formed from a conductive layer having a layered structure and is not etched into a tapered shape, an insulating layer is formed over the gate electrode 209 and the insulating layer is anisotropically etched; thus, an insulating layer in contact with sides of the gate electrode 209 (sidewall) can be formed. A method of manufacturing the sidewall is the same as in Embodiment Mode 1.

After forming the impurity region, heat treatment, infrared light irradiation, or laser irradiation is preferably conducted to activate the impurity element. The activation method is the same as in Embodiment Mode 1.

Further, after a passivation film formed from an insulating layer such as a silicon oxynitride film or a silicon oxide film is formed to cover the conductive layer and the semiconductor layer, heat treatment, infrared light irradiation, or laser irradiation may be conducted to perform hydrogenation. The conditions of hydrogenation are the same as in Embodiment Mode 1.

Figure 7A:
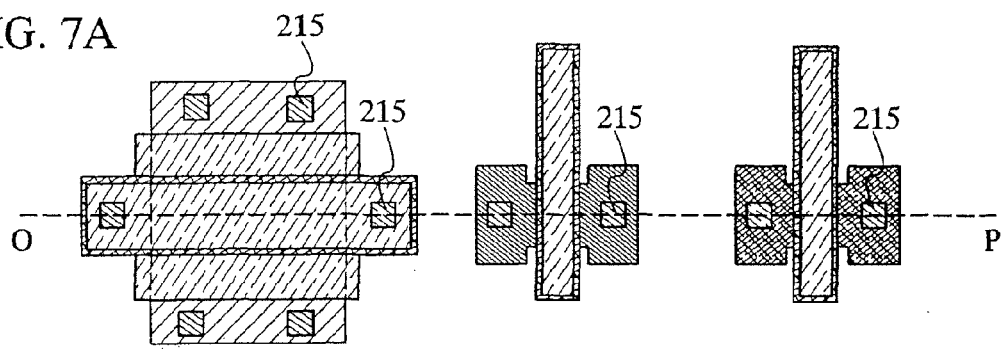
FIGS. 7A to 7D are figures for explaining a manufacturing method of a semiconductor device of the invention.
Figure 7B:
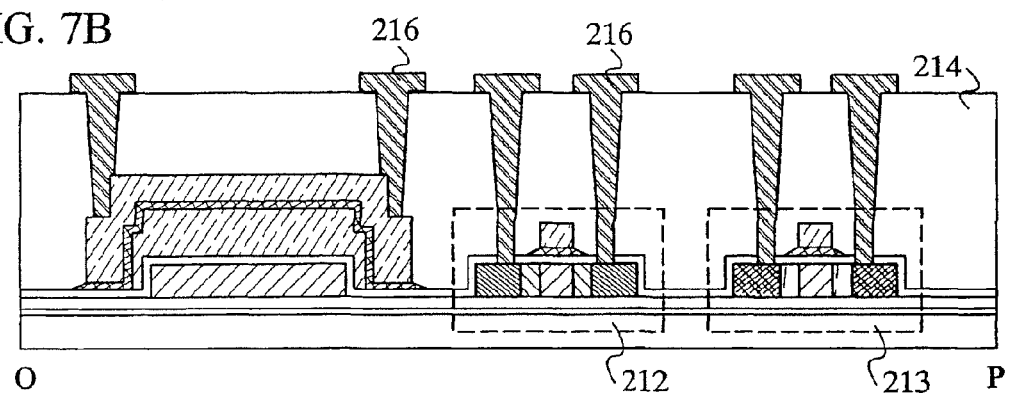

Through the above steps, an n-type semiconductor element 212 and a p-type semiconductor element 213 are formed (FIGS. 7A and 7B). Hereupon, an impurity region is formed in a region which is not covered with the first sacrificial layer 206, the structure layer 207, and the second sacrificial layer 208 in the semiconductor layer 203 forming a microstructure.

Subsequently, a second insulating layer 214 is formed to cover the whole (FIGS. 7A and 7B). The second insulating layer 214 can be formed of an inorganic material, an organic material, or the like, which has an insulating property. The second insulating layer 214 can be manufactured in a similar manner to the second insulating layer 115 in Embodiment Mode 1.

Next, the second insulating layer 214 and the first insulating layer 205 are etched in order to form a first contact hole 215 for connecting a wiring to the semiconductor layers 203 and 204 and the structure layer 207 (FIGS. 7A and 7B). The etching can be conducted by dry etching or wet etching. In this embodiment mode, the first contact hole 215 is formed by dry etching.

Next, a third conductive layer 216 is formed to fill the first contact hole 215 and cover the second insulating layer 214, and formed into a desired shape by patterning; thus, wirings or the like forming a source electrode, a drain electrode, and an electric circuit is formed (FIGS. 7A and 7B). A film formed of an element of aluminum (Al), titanium (Ti), molybdenum (Mo), tungsten (W), or silicon (Si), or an alloy film using the elements can be used for the third conductive layer 216.

In the case where the third conductive layer 216 has a pattern with a corner, the corner portion is preferably formed to have a round pattern as the second conductive layer 117 in Embodiment Mode 1.

Figure 7C:
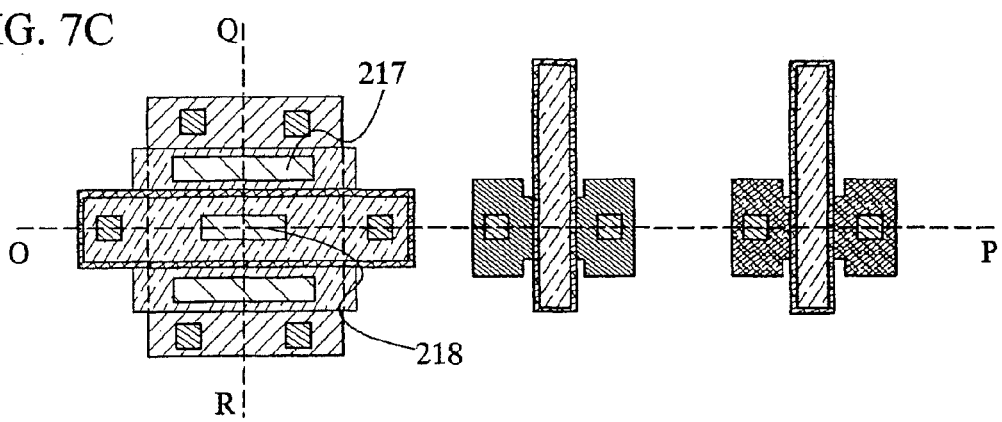
Figure 7D:
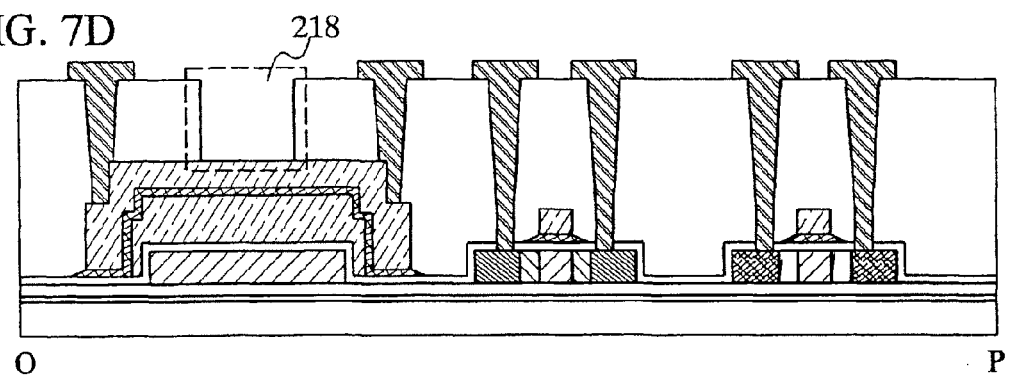

Next, the second insulating layer 214 is etched to form second contact holes 217 and 218. The second contact hole 217 is formed to expose the first sacrificial layer 206, and the second contact hole 218 is formed to expose the second sacrificial layer 208 (FIGS. 7C and 7D). The etching may be conducted by either dry etching or wet etching.

In this embodiment mode, the second contact holes 217 and 218 are formed by dry etching. The second contact holes 217 and 218 are formed to etch away the first sacrificial layer 206 and the second sacrificial layer 208. Accordingly, a diameter of the second contact holes 217 and 218 is necessarily determined so that the etchant flows into the contact holes. For example, the diameter of the second contact holes 217 and 218 is preferably 2 μm or more.

Further, the second contact holes 217 and 218 may be formed to have a diameter such that the first sacrificial layer 206 and the second sacrificial layer 208 are easily etched. Accordingly, the second contact holes 217 and 218 may be formed to expose the whole sacrificial layer with a necessary part of the second insulating layer 214 over the semiconductor layers 203 and 204 left, and they are not necessarily formed as small holes as described above. As a result, time spent removing the sacrificial layer can be reduced.

Figure 8A:
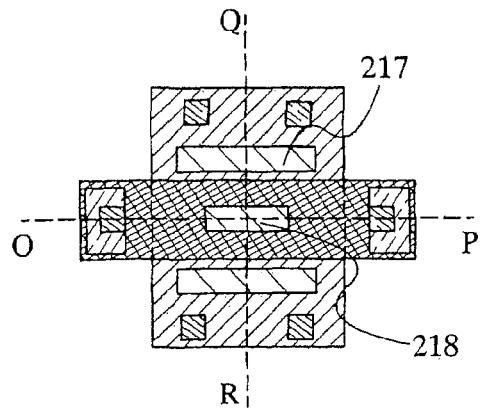
FIGS. 8A to 8E are figures for explaining a manufacturing method of a semiconductor device of the invention.
Figure 8B:
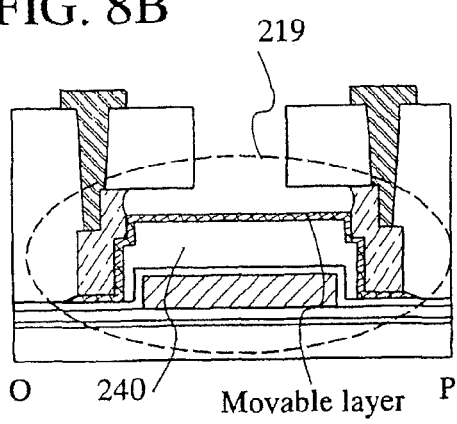
Figure 8C:
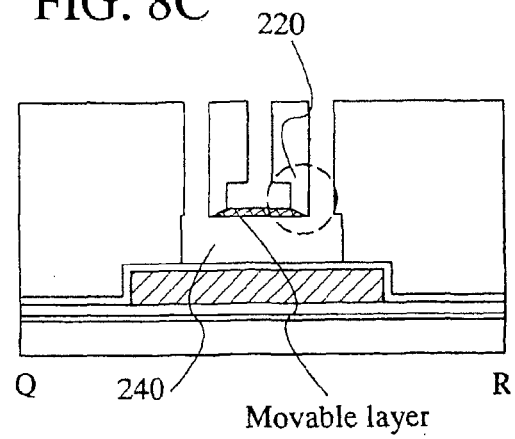

Next, the first sacrificial layer 206 and the second sacrificial layer 208 are etched away (FIGS. 8A, 8B, and 8C). Here, FIGS. 8A to 8C each show only a microstructure. The sacrificial layer can be removed by wet etching or dry etching which is suitable for the material of the sacrificial layer through the second contact holes 217 and 218.

For example, in the case where the first sacrificial layer or the second sacrificial layer is made of tungsten (W), etching is conducted by soaking the layers in a solution in which 28% of ammonia and 31% of oxygenated water are mixed at a ratio of 1:2 for approximately 20 minutes. In the case where the first sacrificial layer or the second sacrificial layer is formed of silicon dioxide, buffered hydrofluoric acid in which 49% hydrofluoric acid solution is mixed with ammonium fluoride at a ratio of 1:7 is used. In the case where the first sacrificial layer or the second sacrificial layer is formed of silicon, phosphoric acid; a hydroxide of an alkali metal such as KOH, NaOH, or CsOH; $NH_4OH$; hydrazine; EPD (a mixture of ethylenediamine, pyrocatechol, and water), a solution of TMAH, IPA, or NMD3; or the like can be used.

In drying after wet etching, rinsing is carried out using a low viscosity organic solvent (for example, cyclohexane); drying is carried out under conditions of low temperature and low pressure; or both of the rinsing and drying can be combined; thus, the microstructure can be prevented from buckling due to capillary action.

Further, the first sacrificial layer or the second sacrificial layer can be removed by dry etching using $F_2$ or $XeF_2$ under a condition of high pressure such as atmospheric pressure.

In addition, in order to prevent the microstructure from buckling due to capillary action caused in a space formed by removing the first sacrificial layer or the second sacrificial layer, the surface of the microstructure may be treated with plasma for providing water repellency.

When the first sacrificial layer 206 and the second sacrificial layer 208 are etched away through such steps, a space 240 is created and a microstructure 219 can be manufactured.

In the method of manufacturing the microstructure 219 descried above, suitable combination of the material of the structure layer 207, the materials of the first sacrificial layer 206 and the second sacrificial layer 208, and an etchant for removing the sacrificial layers are necessarily selected. For example, in the case of using a certain etchant, the first sacrificial layer 206 and the second sacrificial layer 208 may be formed of a material having a higher etching rate than the material of the structure layer 207.

In addition, in the case where the first sacrificial layer 206 and the second sacrificial layer 208 are formed of different materials and they cannot be etched with the same etchant, the sacrificial layers are necessarily etched in different steps. In this case, the selectivity between the sacrificial layers and layers in contact with the etchant, which are not to be removed (for example, the structure layer 207, the second insulating layer 214, and the like) is necessarily determined with due consideration.

Further, as in this embodiment mode, when a structure layer of a microstructure is formed from a conductive layer forming a gate electrode, a microstructure having a supple movable portion having high strength can be manufactured.

When the structure layer 207 and the second sacrificial layer 208 are formed through the above steps, and the sacrificial layers are etched away, the second insulating layer 214 is left and attached to the tapered portion of the structure layer 207 (reference numeral 220 in FIG. 8C). The second insulating layer 214 can be used as a temporary support for preventing the buckling of the structure layer 207 in forming the microstructure 219 by etching the sacrificial layers away.

In the case where the sacrificial layers are removed by wet etching, the etching solution enters between the structure layer 207 and the first insulating layer 205, and the structure layer 207 and the first insulating layer 205 attach each other by capillary action (namely buckles). In order to prevent this, the support can be formed from the second insulating layer 214.

The area where the tapered portion of the structure layer 207 and the second insulating layer 214 attach, is approximately 100 nm square to approximately 1 μm square, and the attachment can be prevented by the support of the second insulating layer 214. However, in the case of using the structure layer 207 in a moving state, the support is not required. Here, charges having different conductivity are severally imparted between the semiconductor layer 203 and the structure layer 207 of the microstructure 219. Accordingly, when voltage is applied, the structure layer 207 is attracted to the semiconductor layer 203 side by the electrostatic force and bends downward, so that the support and the structure layer 207 can be separated. This is because the support and the structure layer 207 attach at a minute area as approximately 100 nm square to 1 μm square.

By manufacturing the microstructure 219 using a support as described above, buckling of the structure layer 207 can be prevented.

Further, microstructures and semiconductor elements having various structures can be manufactured by changing a part of the above steps, or adding another step to the above steps.

Figure 8D:
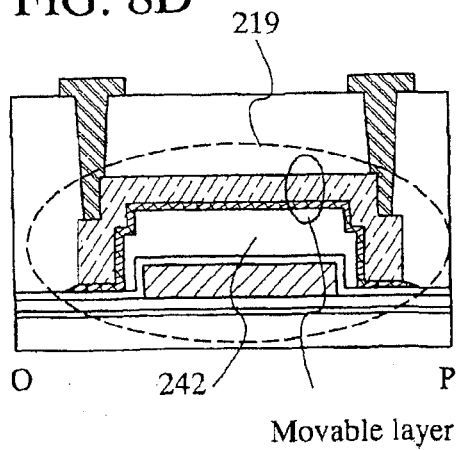
Figure 8E:
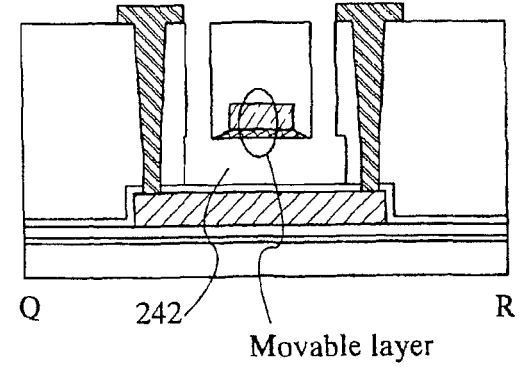

For example, the second sacrificial layer 208 is etched away and only the conductive layer forming the second gate electrode layer 211 is used as the structure layer 207 in the above steps; however, the microstructure can be manufactured without etching the second sacrificial layer 208 away (FIGS. 8D and 8E). In this case, only the first sacrificial layer 206 is required to be etched away, and the second contact hole 218 for etching the second sacrificial layer 208 away is not required to be formed. A space 242 is created by etching the first sacrificial layer 206 away.

Figure 9A:
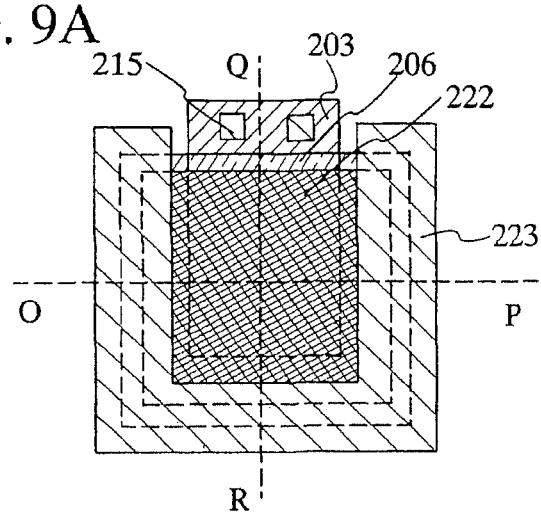
FIGS. 9A to 9E are figures for explaining a manufacturing method of a semiconductor device of the invention.
Figure 9B:
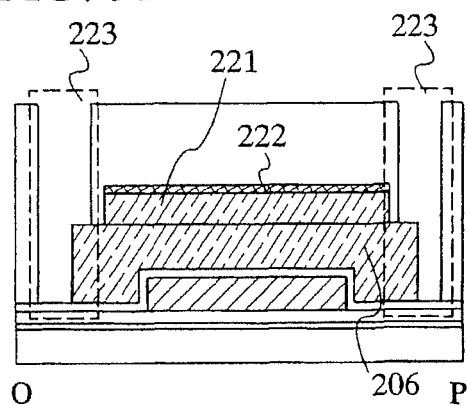
Figure 9C:
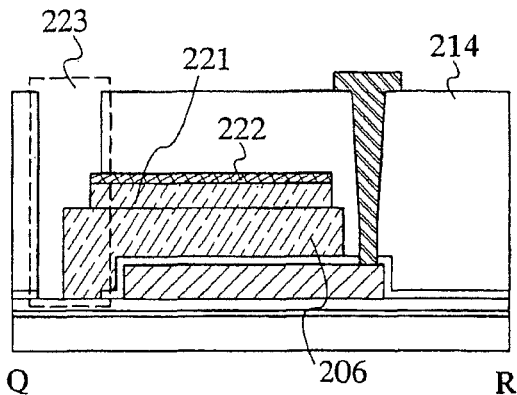
Figure 9D:
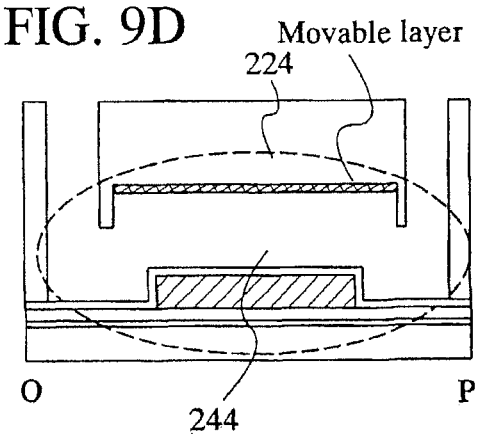
Figure 9E:
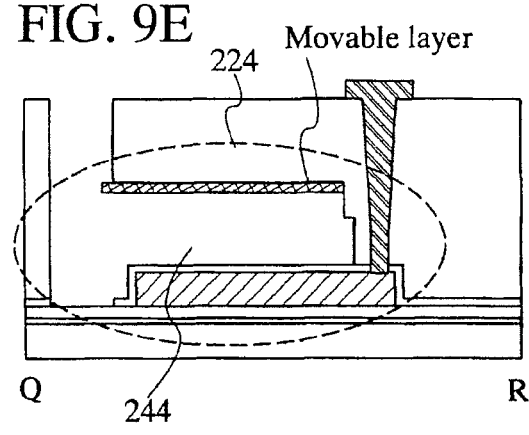

Further, a second sacrificial layer 221 is formed of the same material as the first sacrificial layer 206 over the first sacrificial layer 206, and a fourth conductive layer 222 can be stacked thereafter (FIGS. 9A, 9B, and 9C). Further, when the first sacrificial layer 206 and the second sacrificial layer 221 are etched away, a space 244 is created, and a microstructure in which the fourth conductive layer 222 and the second insulating layer 214 form the structure layer can be manufactured. In the above manner, a microstructure 224 having a space therebelow, which has a function of a capacitor, a cantilever, a switch, or the like can be manufactured (FIGS. 9D and 9E).

Here, a contact hole 223 for etching the sacrificial layer can be formed simultaneously with the formation of the first contact hole 215. Alternatively, the contact hole 223 may be formed after forming the third conductive layer 216 forming a wiring. The shape of the structure layer forming the microstructure may be determined depending in accordance with the shape of the contact hole 223.

Further, in the above example, the first sacrificial layer 206 and the second sacrificial layer 221 are stacked; however, one layer of a sacrificial layer may be formed without forming the first sacrificial layer 206. In addition, in the above example, the first sacrificial layer 206 and the second sacrificial layer 221 are formed of the same material, and the sacrificial layers are simultaneously etched away; however, the present invention is not limited to the example. For example, the first sacrificial layer 206 and the second sacrificial layer 211 can be formed of different materials, and they can be separately etched away in a plurality of steps.

Figure 10A:
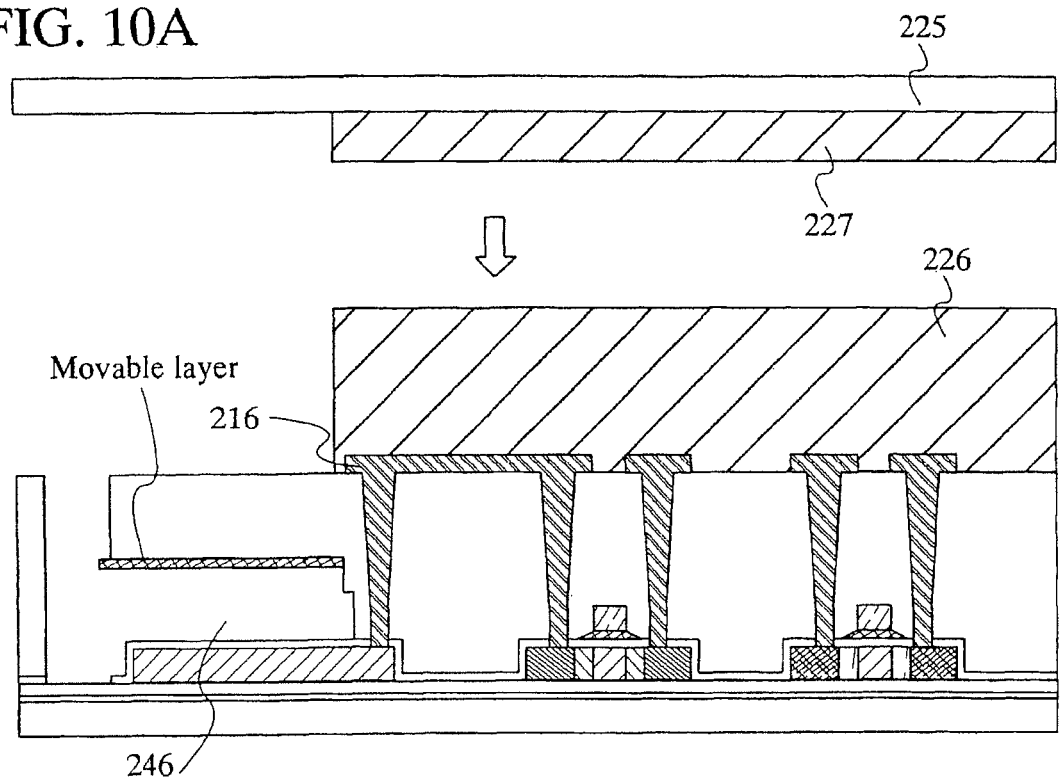
FIGS. 10A and 10B are figures for explaining a manufacturing method of a semiconductor device of the invention.
Figure 10B:
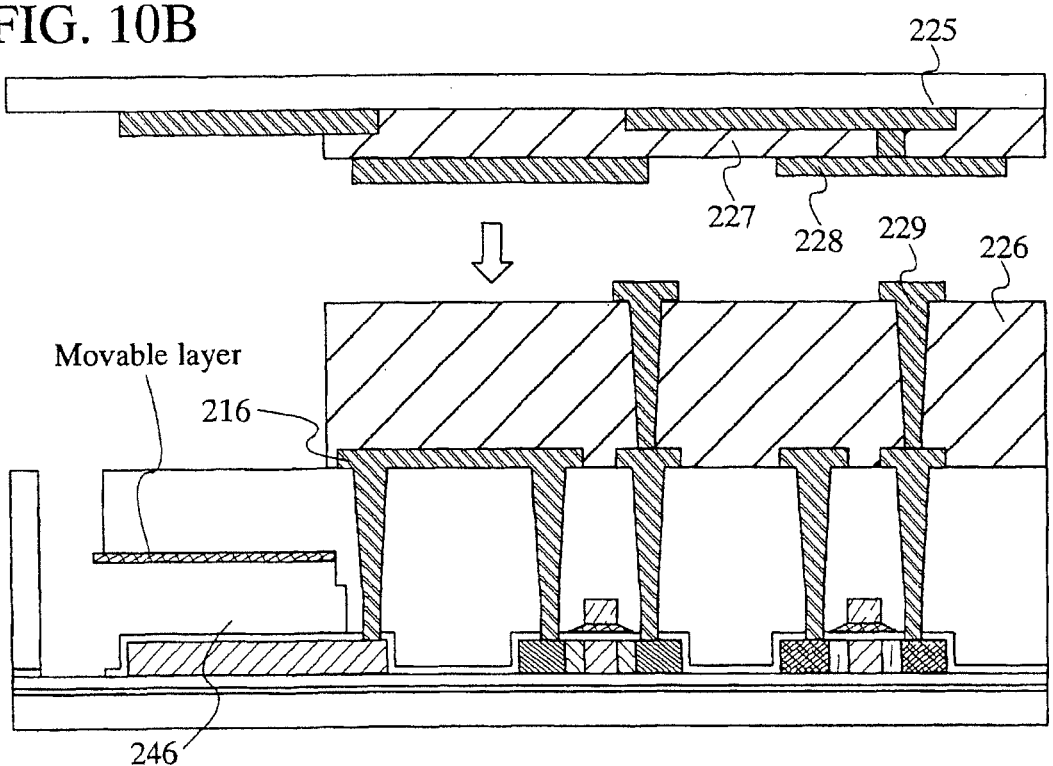

Further, in order to protect the microstructures 219 and 224, a counter substrate 225 can be attached to the semiconductor device manufactured on the substrate 201 (FIGS. 10A and 10B). In the case of attaching the counter substrate 225, after forming the third conductive layer 216 forming a wiring, a second insulating layer 226 is formed on the surface of the substrate 201, an etched into a desired shape. (Here the second insulating layer 214 is used as a first insulating layer.) Hereupon, the second insulating layer 226 is patterned so that the sacrificial layer and a structure layer to be a microstructure are exposed. After that, a microstructure having a space 246 can be manufactured by etching the sacrificial layer away. The space 246 shown in FIGS. 10A and 10B has an open region at one end.

Next, the counter substrate 225 to be attached will be described. A third insulating layer 227 is formed in a portion opposite to the second insulating layer 226 formed over the substrate 201 (FIG. 10A), so as not to break the microstructure by attaching the counter substrate 225. In a portion which is opposite to the microstructure formed on the substrate 201, the insulating layer is not formed and a gap is formed between the substrates, so that the microstructure is not broken when the substrate 201 and the counter substrate 225 are attached, which is preferable.

Further, a fifth conductive layer 228, an antenna, or the like can be provided with the counter substrate 225. The fifth conductive layer 228 is formed into a desired shape by patterning and is corresponding to a wiring which partially constitute a circuit of the semiconductor device (FIG. 10B). In this case, a sixth conductive layer 229 forming a wiring for the connection to the first wiring (a third conductive layer 216, here) is formed over the second insulating layer 226 formed over the substrate 201 is formed. Further, the substrate 201 and the counter substrate 225 can be attached together so that the sixth conductive layer 229 and the fifth conductive layer 228 electrically connect.

In the case where a conductive layer forming a circuit of the semiconductor device is formed on the counter substrate, an anisotropic conductive material is desirably used to electrically connect the conductive layer formed over the substrate and the conductive layer formed over the counter substrate; thus, the substrate and the counter substrate are attached. Here, an anisotropic conductive paste (ACP) cured by heat or an anisotropic conductive film (ACF) cured by heat can be use for the anisotropic conductive material. It has conductivity only in a certain direction (here, in a direction perpendicular to the substrate). The anisotropic conductive paste is referred to as a binder layer which has a structure in which particles having conductive surfaces (hereinafter referred to as conductive particles) are dispersed in a layer containing an adhesive as its main component. The anisotropic conductive film has a structure in which particles having conductive surfaces (hereinafter referred to as conductive particles) are dispersed in a thermosetting or thermoplastic resin film. Note that spherical resins plated with nickel (Ni), gold (Au), or the like are used for the particles having conductive surfaces. In order to prevent electric short circuit between conductive particles in an unnecessary part, insulating particles of silica or the like may be mixed therein. Further, in the case of forming only the insulating layer on the counter substrate, the substrate and the counter substrate can be attached together using an adhesive without conductivity.

Hereupon, in order to protect the microstructures 219 and 224 formed over the substrate 201 as in the above process, it is desirable that a third insulating layer 227 is preferably formed over a portion which is not opposed to a front of the microstructure and a connection portion of the second conductive layer and the third conductive layer, so that the counter substrate 225 is not in contact with the microstructures 219 and 224. Further, the fifth conductive layer 228 may be formed only above the third insulating layer 227, or may be formed above and below the third insulating layer 227, so that the conductive layers are electrically connected (FIG. 10B).

In addition, semiconductor device manufactured by the above steps can be separated from the substrate 201 and attached to another substrate or an article. For example, a semiconductor device can be manufactured on a glass substrate, and thereafter transferred to a flexible substrate of plastics or the like, which is thinner and softer than glass.

Figure 11A:
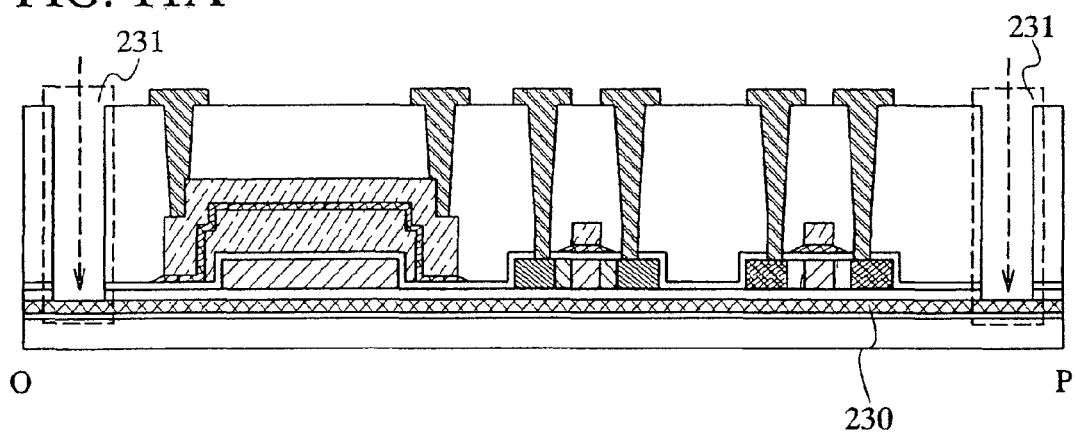
FIGS. 11A to 11C are figures for explaining a manufacturing method of a semiconductor device of the invention.

In the case of separating the semiconductor device from the substrate 201, a release layer 230 is formed when the base film 202 is manufactured (FIG. 11A). The release layer 230 can be formed under the base film or between stacked layers of the base film. Further, after forming the third conductive layer 216 in the above steps, the semiconductor device is separated from the substrate before forming the second contact holes 217 and 218 for etching the sacrificial layer.

Figure 11B:
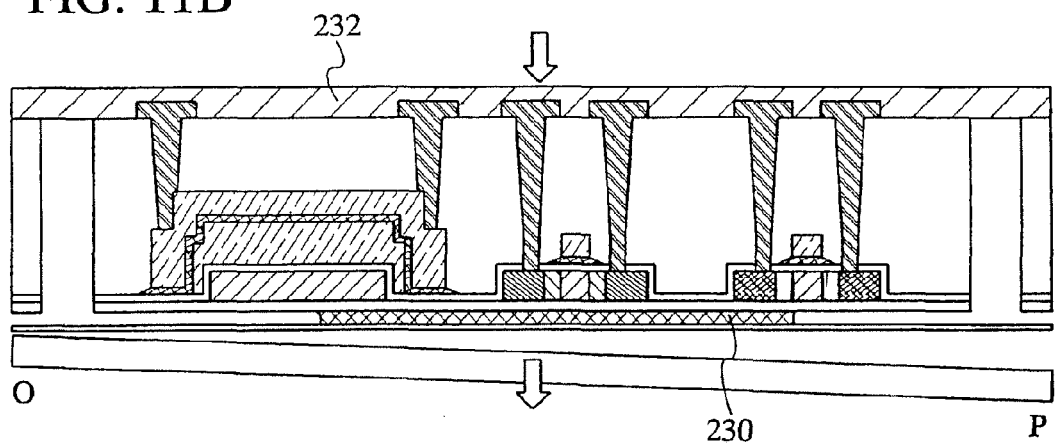
Figure 11C:
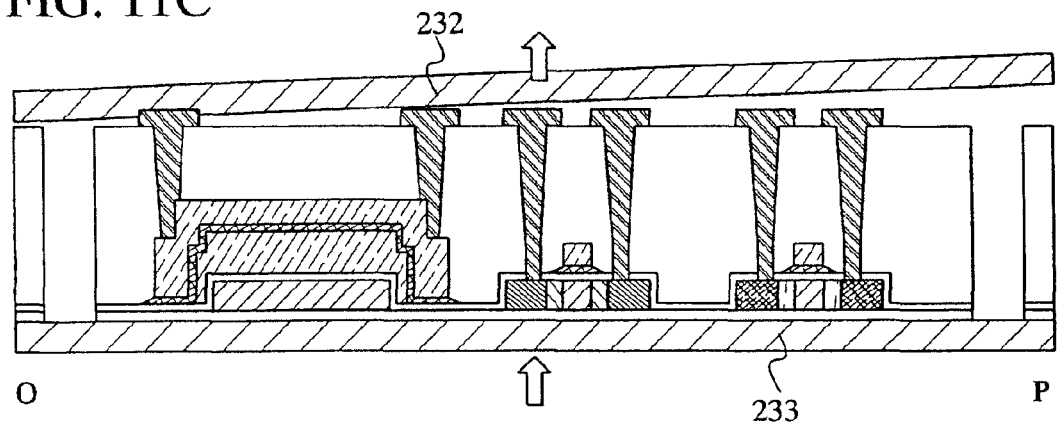

There are various methods for the separation; however, one example is shown here. First, an opening 231 is formed to expose the release layer 230 and an etchant is introduced into the opening 231, thereby partially removing the release layer 230 (FIG. 11B). Next, a substrate 232 for the separation is attached above a top surface side of the substrate 201, and the semiconductor element and the microstructure are separated from the substrate 201 at a boundary of the release layer 230, and they are transferred to the substrate 232. Next, a flexible substrate 233 is attached to a side of the substrate 201 where the semiconductor element and the microstructure have been attached (FIG. 11C). Then the substrate 232 attached above the top surface side is peeled off, thereby transferring the substrate.

Further, a contact hole is formed to expose the sacrificial layer, and the sacrificial layer is etched away; thus, a microstructure is manufactured. Further, a protective film may be formed over the wiring so as to protect third conductive layer 216 or the like at the time of peel-off.

In addition, in the case where the microstructure is necessarily protected, the counter substrate 225 described above can be attached.

Although this embodiment mode explains a method in which the release layer 230 is etched through the opening 231 and the semiconductor element and the microstructure are thereafter transferred to the other substrate 233, the present invention is not limited to the example. For example, there is a method in which the release layer 230 is removed only by etching, and thereafter the semiconductor element and the microstructure are transferred to the other substrate 233, or a method in which the release layer 230 is not provided, the substrate 232 for the separation is attached above the top surface side of the substrate 201 and the semiconductor element and microstructure are separated from the substrate 201. In addition, there is also a method in which the back surface of the substrate 201 is polished to obtain the semiconductor element and the microstructure. Such methods may be suitably combined to be carried out. In the case of using a method except for a method in which the back surface of the substrate 201 is polished and if the step of transferring to the other substrate 233 from the substrate 201 is adopted, the substrate 201 can be reused, which is advantageous.

As described above, in the case where the semiconductor element and the microstructure manufactured over the substrate 201 are peeled off and attached to the flexible substrate 233, a thin, soft, and compact semiconductor device can be manufactured.

As in the above process, since laser crystallization or laser crystallization using a metal can be conducted at a lower temperature than crystallization using only heat, wider variety of materials can be used for the process. For example, in the case where the semiconductor layer is crystallized only by heat, heating at a temperature of about 1000° C. for about one hour is required, so that a glass substrate sensitive to heat or a metal whose melting point is 1000° C. or less cannot be used. However, in a process using the above metal, a glass substrate having a strain point of 593° C. or the like can be used.

Further, compared with a semiconductor layer formed only by thermal crystallization, a semiconductor layer formed through the above process has a continuous grain boundary and covalent bonds therein are not broken. Therefore, stress concentration due to defects of dangling bonds between grain boundaries does not occur, and fracture stress is consequently increased as compared with general polycrystalline silicon.

Further, internal residual stress generally exists in amorphous silicon after it is formed into a film. Therefore, it is difficult to form amorphous silicon into a thick film. On the other hand, in polycrystalline silicon manufactured using the above process, the internal stress is reduced and polycrystalline silicon can be easily formed into a film through a process at a low temperature. Accordingly, a semiconductor layer having an arbitrary thickness can be obtained by repeating film formation and crystallization. Further, another material may be patterned over the semiconductor layer, and another semiconductor layer can be formed over the semiconductor layer.

An alloy of silicon such as nickel silicide is generally known to have high strength. When a metal used for crystallization is selectively left in the semiconductor layer, and suitable heat treatment is conducted, a harder microstructure 219 having high conductivity can be manufactured. Consequently, an alloy of silicon is excellent in the case where a semiconductor layer is used as an electrode under the microstructure as described above.

Further, the invention can provided a semiconductor device which can be manufactured without assembly or packaging at low cost by manufacturing a microstructure and a semiconductor element on one substrate.

This embodiment mode can be freely combined with the above embodiment mode.

Embodiment Mode 3

In this embodiment mode, an example of a semiconductor device described in the above embodiment modes is shown. In a semiconductor device of the present invention, a sensor device 301 can be manufactured using a detector element which is formed from a microstructure.

Figure 12A:
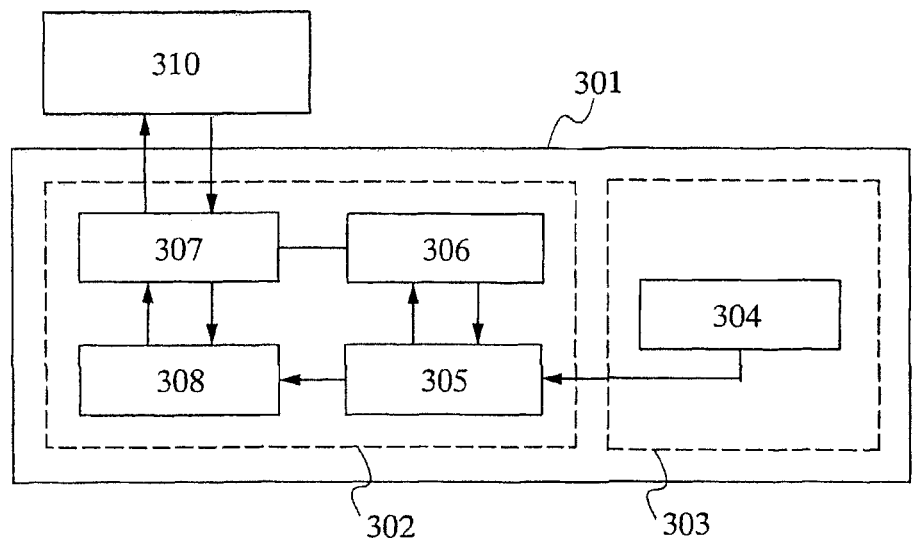
FIGS. 12A and 12B are figures for explaining one mode of a semiconductor device of the invention.

FIG. 12A shows a structure of the sensor device 301 which is one mode of a semiconductor device of the invention. The sensor device 301 in this embodiment has an electric circuit portion 302 having a semiconductor element and a structure portion 303 including a microstructure.

The structure portion 303 has a detector element 304 formed from a microstructure, which detects external pressure, concentration of a substance, flow rate of gas or fluid, or the like.

The electric circuit portion 302 includes an AD converting circuit 305, a control circuit 306, an interface 307, a memory 308, and the like.

The AD converting circuit 305 converts information sent from the detector element into a digital signal. The control circuit controls the AD converting circuit, so that the digital signal is stored in the memory, for example. The interface 307 is supplied with drive power or receives a control signal from an external control device 310, or transmits information obtained by the sensor device 301 to the external control device 310, for example. The memory stores obtained information, information specific to the sensor device, or the like.

Further, the electric circuit portion 302 can have an amplifier circuit which amplifies a signal received from the structure portion 303, a central processing circuit for processing information obtained by the structure portion 303, and the like.

The external control device 310 transmits a control signal the sensor device 301, receives information obtained by the sensor device 301, or supplies drive power to the sensor device, for example.

The sensor device 301 having the above structure can detect external pressure, concentration of a substance, flow rate of gas or fluid, temperature, and the like. Further, since the sensor device has a central processing circuit, a sensor device in which detected information is processed in the sensor device and a control signal for controlling other devices is generated and output, can be realized.

Figure 12B:
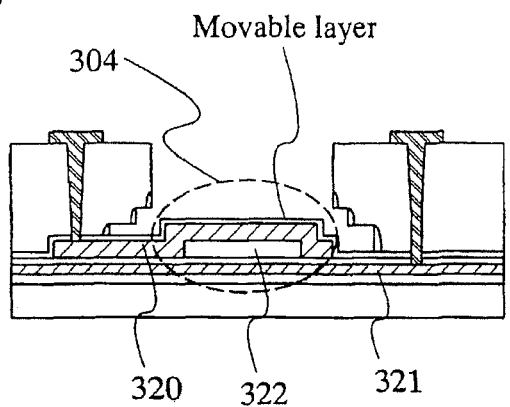

FIG. 12B shows a cross-sectional view of a structural example of the detector element 304. The detector element 304 shown in FIG. 12B has a second conductive layer 321 below a base film and a first conductive layer 320 as a structure layer, which form a capacitor. The detector element 304 further has a space 322 below the first conductive layer 320. Further, since the first conductive layer 320 is moved by electrostatic force, pressure, or the like, the detector element 304 is a variable capacitor in which distance between the first conductive layer and the second conductive layer changes.

Utilizing this structure, the detector element 304 can be used as a pressure detector element in which the first conductive layer 320 is moved due to pressure.

Further, in the detector element 304 shown in FIG. 12B, the first conductive layer 320 can be manufactured by stacking two kinds of materials having different coefficients of thermal expansion. In this case, since the first conductive layer 320 is moved by a temperature change, the detector element 304 can be used as a temperature detector element.

The present invention is not limited to the above configuration examples. Accordingly, the sensor device of this embodiment mode has an electric circuit including a semiconductor element and controls a microstructure, and a detector element manufactured using the microstructure which is controlled by the electric circuit and detects some physical quantity. Further, the above sensor device is manufactured by a manufacturing method described in any one of the above embodiment modes.

This embodiment mode can be freely combined with any one of the above embodiment modes.

Embodiment Mode 4

This embodiment mode will describe an specific example of a semiconductor device described in the above embodiment modes. A semiconductor device of the invention can be manufactured using a memory device which has a memory element formed from a microstructure. In this embodiment mode, an example of a memory device in which a peripheral circuit such as a decoder or the like is formed from a semiconductor element or the like, and the inside of a memory cell interior is formed from a microstructure will be described.

Figure 13:
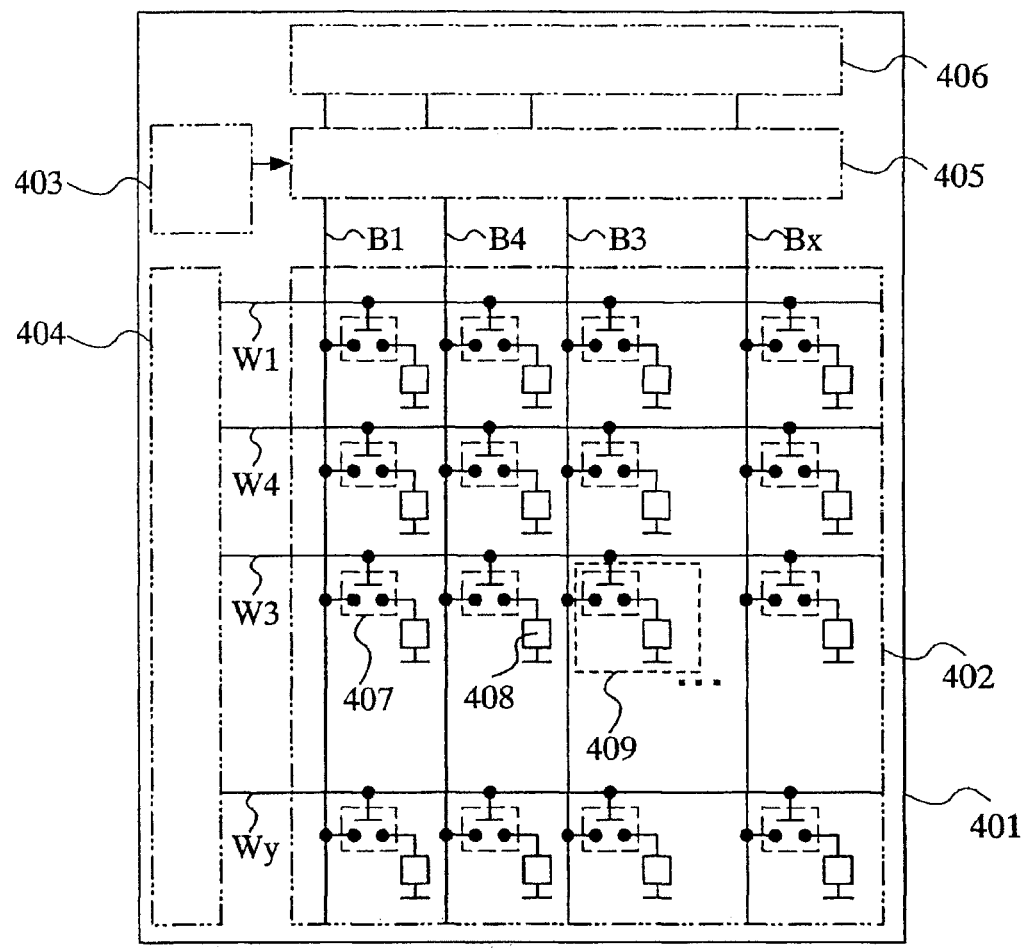
FIG. 13 is a figure for explaining a structure of a memory cell.

FIG. 13 shows a structure of the memory device 401 which is one mode of a semiconductor device of the present invention.

The memory device 401 includes a memory cell array 402, a decoder 403 and 404, a selector 405, and a reader/writer circuit 406. A known technology can be used for the structures of the decoder 403 and 404 and the selector 405.

The memory cell 409 can have, for example, a memory element 408 and a switching device 407 for controlling the memory element. In the memory device 401 described in this embodiment mode, the switching device 407 and/or the memory element 408 are formed from a microstructure.

Figure 14A:
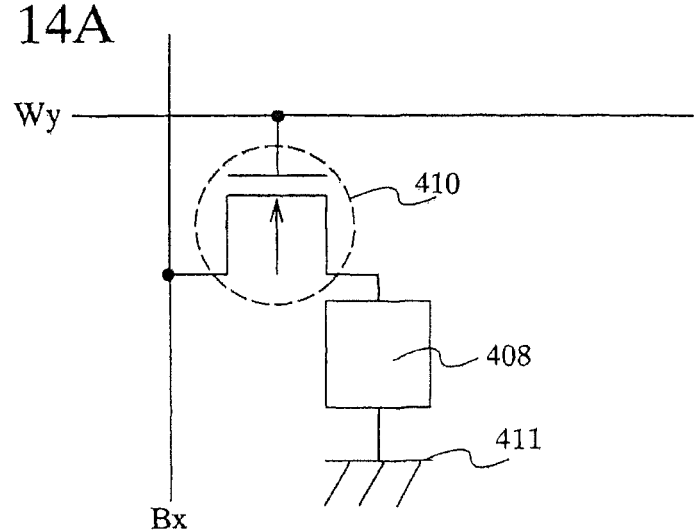
FIGS. 14A and 14B are figures for explaining a structure of a memory cell.
Figure 14B:
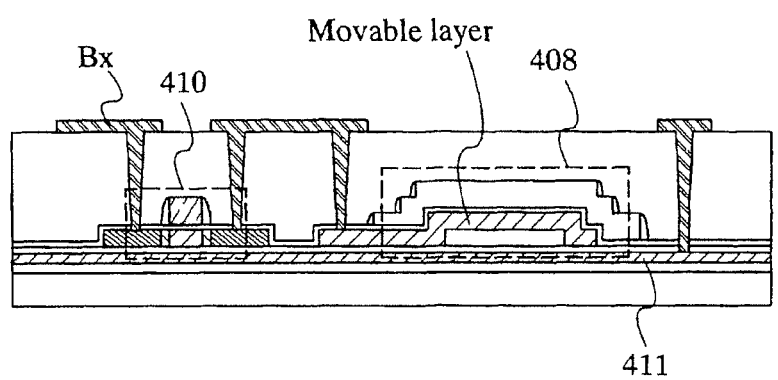

FIGS. 14A and 14B show a configuration example of the memory cell 409. FIG. 14A is a circuit diagram of the memory cell 409, and FIG. 14B is a cross-sectional view of the structure.

As shown in FIG. 14A, the memory cell 409 includes a switching device 407 formed of a transistor 410 and the memory element 408 formed from a microstructure.

As shown in FIG. 14B, the memory element 408 is formed from a microstructure manufactured using a manufacturing method described in Embodiment Mode 1 or Embodiment Mode 2. The memory element 408 has a capacitor including a first conductive layer under a base film and a second conductive layer as a structure layer. Further, the second conductive layer is connected to one of two high concentration impurity regions of the switching device 407.

Further, the first conductive layer is commonly connected to the memory element 408 of each memory cell 409 in the memory device 401. The first conductive layer is a common electrode 411 which applies the same potential to each memory element at the time of reading and writing of the memory device.

Figure 15:
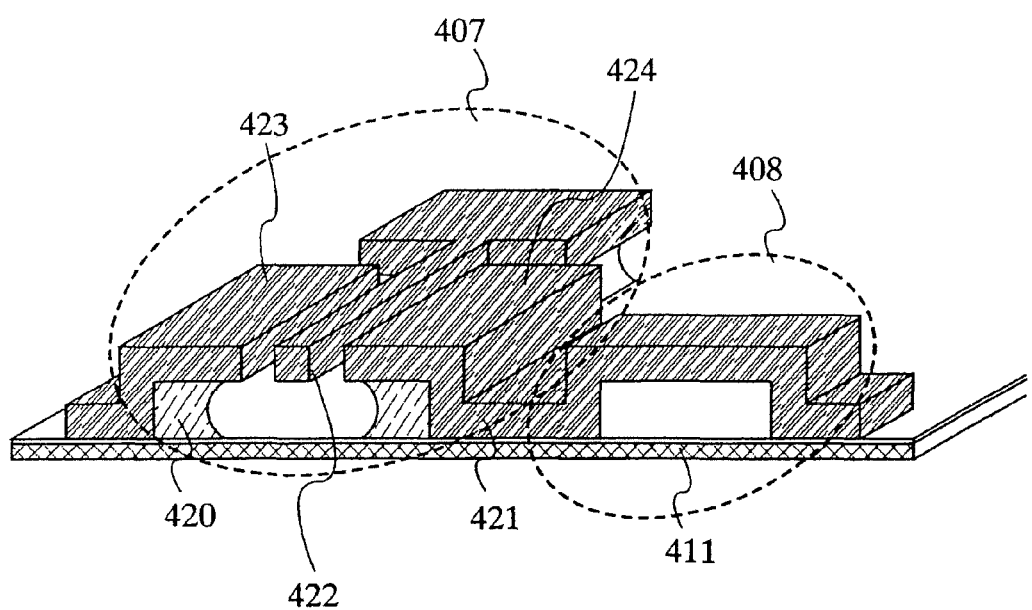
FIG. 15 is a figure for explaining one mode of a semiconductor device according to the invention.

FIG. 15 shows an example of a memory cell 409 having a switching device 407 and a memory element 408 which are formed from a microstructure. FIG. 15 is a perspective view of the structure of the memory cell 409.

The switching device 407 and the memory element 408 are manufactured by a manufacturing method described in Embodiment Mode 1 or Embodiment Mode 2. The switching device 407 is a microstructure which serves as a switch having a structure of combined cantilevers, and the memory element 408 is a microstructure which serves as a capacitor having a beam structure.

Here, the structure of the switching device 407 will be described. In the switching device 407, a sacrificial layer 420 and a structure layer 421 are stacked over a substrate, and a portion under a movable cantilever 422 is etched. Further, the structure layer 421 includes a control electrode 423 and a conductor 424.

A switch manufactured using a microstructure has an advantage that a signal transmitting pathway through the switch is completely insulated at the time of OFF. Further, there is another advantage that a control system for controlling ON/OFF of the switch and the signal transmitting pathway can be insulated.

A memory device having the above configuration can be used as a volatile memory typified by a DRAM (Dynamic Random Access Memory). A known technology can be used for the configuration of the peripheral circuit and the drive method or the like.

As to a microstructure forming a memory cell, a scaling law is applied when the microstructure is manufactured to have a minute size (for example, in units of μm), so that the response speed of the switch is fast, and high drive power is not required, which is an advantage. Further, by manufacturing the switching device 407 from a microstructure, a selected memory element 408 can be completely insulated, and the low power consumption in the memory device 401 can be realized.

This embodiment mode can be freely combined with any one of the above embodiment modes.

Embodiment Mode 5

In this embodiment mode, an example of the semiconductor device described in the above embodiment mode will be explained.

A semiconductor device of the present invention can be manufactured as, for example, a fractionation device for fractionating a particular material from a compound. The fractionation device will be described below.

Figure 16A:
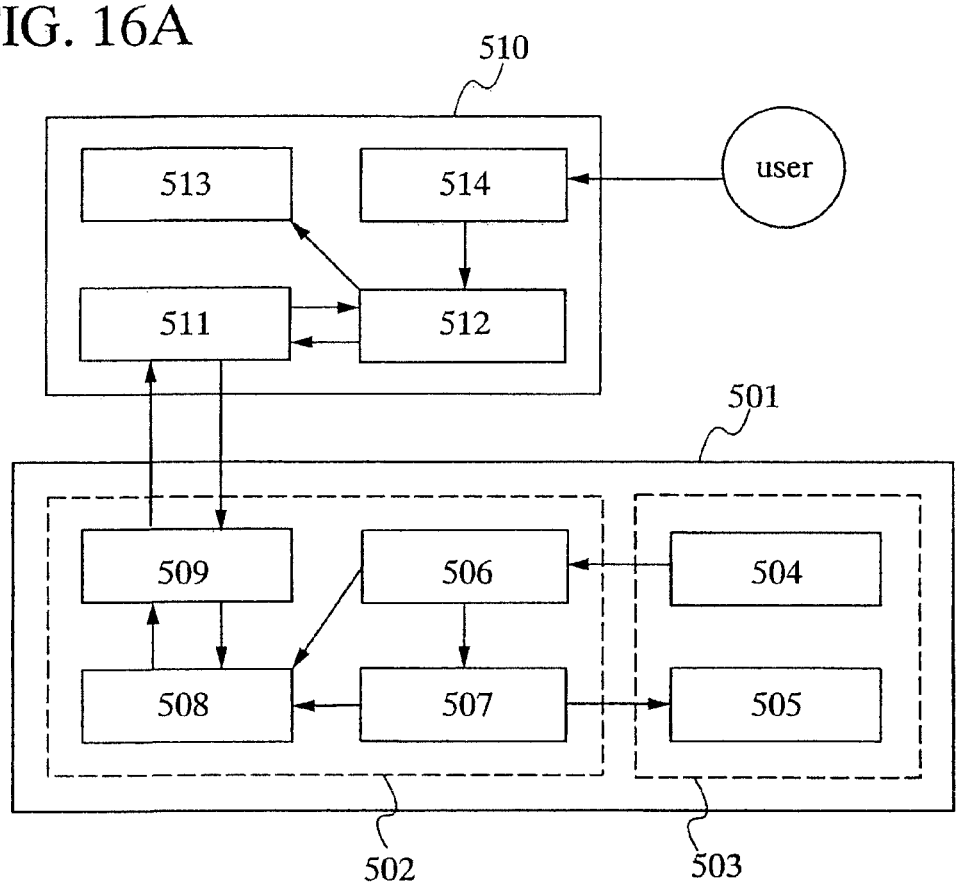
FIGS. 16A and 16B are figures for explaining one mode of a semiconductor device according to the invention.

FIG. 16A shows a fractionation device which fractionates gas of a particular material from a gas mixture of two or more materials as a basic configuration example of the fractionation device of this embodiment mode.

A fractionation device 501 is broadly divided into two parts of an electric circuit portion 502 and a structure portion 503. The structure portion 503 includes a detector device 504 and a plurality of switching devices 505. The electric circuit portion 502 includes a signal processing device 506, a switch controller device 507, an information storing device 508, and a communication device 509.

Here, the detector device 504 and the switching device 505 are formed from a microstructure which has a size corresponding to a gas molecule to be fractionated. One detector device 504 is provided adjacent to one switching device 505, and detects what kind of material exists near the switching device 505. The switching device 505 has a passage, which is opened only when a control signal is sent from the switch controller device 507 and a particular material exists near the switching device 505, so that the particular material passes therethrough.

The signal processing device 506 amplifies a signal transmitted from the detector device 504 and processes it by AD conversion or the like, and the signal is transmitted to the switch controller device 507. The switch controller device 507 controls the switching device 505 based on a signal transmitted from the detector device 504. The information storing device 508 stores a program file for operating the fractionation device 501, information specific to the fractionation device 501, and the like. The communication device 509 communicates with an external control device 510.

The external control device 510 includes a communication device 511, an information processing device 512, a display device 513, and an input device 514, and the like.

The communication device 511 is a device for the operations of transmitting a signal for controlling the fractionation device 501, receiving information obtained by the fractionation device 501, supplying power to the fractionation device 501, or the like. The information processing device 512 is a device for the operations of processing information received by the fractionation device 501, processing information input by the input device for transmitting the information to the fractionation device 501, or the like. The display device 513 displays information obtained by the fractionation device 501, the operation status of the fractionation device 501, or the like. The input device 514 is a device by using which a user can input information.

Figure 16B:
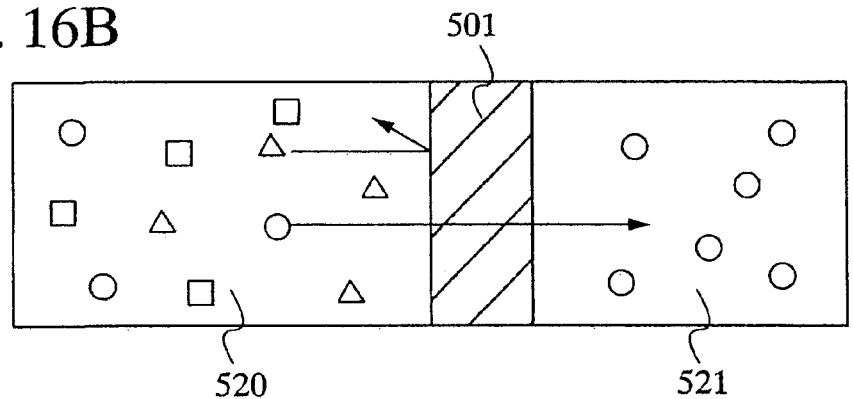

FIG. 16B shows one mode of using the fractionation device 501. The fractionation device 501 having the above configuration is disposed between a mixed material layer 520 and a particular material layer 521. After the fractionation device 501 receives information of which material to be fractionated or the like from the external control device 510, the detector device 504 senses what kind of material exists adjacent to the switching device 505. Next, a detection signal is processed by the signal processing device 506 and transmitted to the switch controller device 507. The switch controller device 507 controls the switching device 505 to open the passage only when a material to be fractionated exists closely to the switching device 505. Further, the switching device 505 passes only a material to be fractionated through the passage in accordance with control by the switch controller device 507.

Through the above operations, the fractionation device 501 can fractionate a gas of a particular material from a mixed gas of two or more gases. Further, the fractionation device 501 is not limited to fractionation of gases. For example, using the above configuration, the fractionation device can be formed as a device for fractionating a particular cell. As an example, the fractionation device 501 can be controlled to fractionate only a cell which fluoresces when irradiated with UV light. Alternatively, a fractionation device having a function of fractionating particles having a minute grain boundary, for example, only particles containing a radioactive substance, fractionating magnetic ore particles, or the like can be obtained.

The invention can provide a fractionation system including the fractionation device 501, the mixed material layer 520, the particular material layer 521, and the external control device 510, which can fractionates a particular material from a mixed material.

This embodiment mode can be freely combined with any one of the above embodiment modes.

Embodiment 1

The structure layer of a semiconductor device of the present invention can be formed by stacking a layer containing polycrystalline silicon crystallized by the aforementioned steps and a layer containing amorphous silicon. Silicon layers with different crystal states such as the layer containing polycrystalline silicon as described above and the layer containing amorphous silicon have different mechanical properties. Therefore, by forming a structure layer by stacking layers or forming layers in selected regions, a microstructure suitable for various applications can be formed. In this embodiment, results of measuring the mechanical properties of these layers will be shown.

In order to measure the difference between mechanical properties of silicon layers with different crystal states, a complex elasticity and an indentation hardness of a layer containing amorphous silicon and a layer containing polycrystalline silicon formed by CVD were measured. Here, the layer containing polycrystalline silicon was formed by crystallizing a layer containing amorphous silicon by laser irradiation using a metal catalyst.

The layer containing amorphous silicon used as a sample was formed by forming a silicon nitride layer with a thickness of 50 nm and a silicon oxide layer with a thickness of 100 nm over a quartz substrate as base layers by CVD and a layer containing amorphous silicon over the base layers by CVD.

The layer containing polycrystalline silicon used as a sample was formed by crystallizing a layer containing amorphous silicon formed similarly to the aforementioned manner by using a continuous wave laser. Here, the energy density of the laser beam used for the crystallization was 9 W/cm$^2$ to 9.5 W/cm$^2$ and the scan rate was 35 cm/sec.

The layer containing amorphous silicon used as a sample was formed with a thickness of 66 nm while the layer containing polycrystalline silicon crystallized by laser irradiation had a thickness of about 60 nm.

The measurement was carried out by the nanoindentation measurement in which an indenter having a triangular pyramid shape is pressed into the sample. The measurement was carried out under a condition of pressing a single indenter, which is a Berkovich indenter made of diamond. Therefore, the elasticity of the indenter is about 1000 GPa and the Poisson's ratio is about 0.1.

The measured complex elasticity is the elasticity obtained by combining the elasticity of the sample and the indenter, which is expressed by the following formula (1). In the formula (1), Er represents complex elasticity, E represents a Young's modulus, and v represents a Poisson's ratio. The first member (expressed as sample) of the formula (1) is a member to which the elasticity of the sample contributes while the second member (expressed as indenter) is a member to which the elasticity of the indenter contributes.

As shown in the formula (1), the complex elasticity is found by the sum of the first member to which the elasticity of the sample contributes and the second member to which the elasticity of the indenter contributes. However, the elasticity of the indenter is quite higher than that of the sample, therefore, the second member is negligible. As a result, the complex elasticity approximately equals to the elasticity of the sample.

The indentation hardness is hardness measured by an indentation method, which is obtained by dividing the maximum press loads of the indenter by the projection area at the time of maximum pressing. Here, the projection area at the time of pressing is obtained by a geometric shape of the indenter and the depth of contact at the time of pressing the indenter into the sample. The indentation hardness multiplied by 76 can be equivalently handled as Vicker's hardness which is generally used as an index of hardness.

$$\frac{1}{Er} = \left(\frac{1-v^2}{E}\right)_{sample} + \left(\frac{1-v^2}{E}\right)_{indenter} \quad (1)$$

Table 1 shows the measurement result of the complex elasticity and the indentation hardness of the layer containing polycrystalline silicon and the layer containing amorphous silicon. The result shows average values of three times of the measurement.

As shown in Table 1, the layer containing polycrystalline silicon has higher elasticity than the layer containing amorphous silicon. Accordingly, when force to bend the structure is given, the layer containing polycrystalline silicon is more resistant to the breakage caused by bending than the layer containing amorphous silicon.

Furthermore, as shown in the result in Table 1, the layer containing polycrystalline silicon is harder than the layer containing amorphous silicon.

TABLE 1

| Sample | complex elasticity (GPa) | indentation hardness (GPa) |
|---|---|---|
| layer containing polycrystalline silicon | 141 | 15.5 |
| layer containing amorphous silicon | 153 | 20.3 |

In this manner, by stacking semiconductor layers with different elasticity and hardness, a microstructure having hardness and suppleness resistant to bending stress can be formed. For example, by stacking the aforementioned layers, even when a breaking occurs due to a crystal defect in the layer containing polycrystalline silicon, the breaking does not easily propagate to the layer containing amorphous silicon. Therefore, the breaking can be stopped therein. In this manner, suppleness and hardness can be balanced in accordance with the ratio of the thicknesses of the stacked layers.

As described above, layers of silicon or silicon compounds which have different characteristics are stacked or partially formed. Thus, a microstructure having a structure layer having desired characteristics such as suppleness, hardness, or conductivity can be manufactured.

This application is based on Japanese Patent Application serial no. 2005-156472 filed in Japan Patent Office on May, 27, 2005, the entire contents of which are hereby incorporated by reference.

What is claimed is:

1. A method for manufacturing a semiconductor device comprising the steps of:
   forming a first sacrificial layer containing one selected from the group consisting of silicon oxide, silicon nitride, a metal element, and a metal compound over a first substrate;
   forming a layer containing polycrystalline silicon crystallized by using a metal over the first sacrificial layer;
   forming a second sacrificial layer containing one selected from the group consisting of silicon, a compound of silicon, a metal element, and a metal compound over the layer containing polycrystalline silicon;
   forming a first insulating layer over the second sacrificial layer;

forming a microstructure comprising the layer containing polycrystalline silicon and the first insulating layer by removing a portion or a whole of the first sacrificial layer and the second sacrificial layer by etching;

forming an interlayer insulating layer over the microstructure;

forming a connection conductive layer over the interlayer insulating layer, wherein the connection conductive layer is electrically connected to the microstructure; and separating the microstructure from the first substrate.

2. The method for manufacturing a semiconductor device according to claim 1 further comprising the steps of:

forming a second insulating layer over a second substrate; and attaching the first substrate and the second substrate so that they are opposite to each other.

3. The method for manufacturing a semiconductor device according to claim 2 further comprising the steps of:

providing a contact hole in the first insulating layer;

forming a first conductive layer containing a metal element or a metal compound over the first insulating layer and in the contact hole;

removing a portion or a whole of the first sacrificial layer and the second sacrificial layer by etching; and forming a second conductive layer containing a metal element or a metal compound over the second insulating layer, wherein the first substrate and the second substrate are attached using an anisotropic conductive material so that the first conductive layer and the second conductive layer are electrically connected to each other.

4. The method for manufacturing a semiconductor device according to claim 2 further comprising the steps of:

providing a first contact hole in the first insulating layer;

forming a first conductive layer containing a metal element or a metal compound over the first insulating layer and in the first contact hole;

forming a third insulating layer over the first conductive layer;

providing a second contact hole in the third insulating layer;

forming a second conductive layer containing a metal element or a metal compound over the third insulating layer and in the second contact hole;

removing a portion or a whole of the first sacrificial layer and the second sacrificial layer by etching; and forming a third conductive layer containing a metal element or a metal compound over the second insulating layer, wherein the first substrate and the second substrate are attached using an anisotropic conductive material so that the second conductive layer and the third conductive layer are electrically connected to each other.

5. The method for manufacturing a semiconductor device according to claim 2, wherein the second insulating layer is formed in a region which is not opposite to a region where a portion or a whole of the first sacrificial layer and the second sacrificial layer is removed by etching.

6. The method for manufacturing a semiconductor device according to claim 1, wherein the first substrate comprises an insulating surface.

7. The method for manufacturing a semiconductor device according to claim 1, wherein the metal is added selectively to a layer to be the layer containing polycrystalline silicon.

8. The method for manufacturing a semiconductor device according to claim 1, wherein the layer containing polycrystalline silicon comprises a layered structure of polycrystalline silicon that is crystallized by thermal crystallization or laser crystallization using the metal and amorphous silicon.

9. The method for manufacturing a semiconductor device according to claim 1, wherein the metal used for crystallization of polycrystalline silicon is one or more of Ni, Fe, Ru, Rh, Pd, Os, Ir, Pt, Cu, and Au.

10. The method for manufacturing a semiconductor device according to claim 1, wherein the layer containing polycrystalline silicon is movable.

11. A method for manufacturing a semiconductor device comprising the steps of:

forming a first conductive layer containing a metal element or a metal compound over a first substrate;

forming a first sacrificial layer containing one selected from the group consisting of silicon oxide, silicon nitride, a metal element, and a metal compound over the first conductive layer;

forming a layer containing polycrystalline silicon crystallized by using a metal over the first sacrificial layer;

forming a second sacrificial layer containing one selected from the group consisting of silicon, a compound of silicon, a metal element, and a metal compound over the layer containing polycrystalline silicon;

forming a first insulating layer over the second sacrificial layer;

forming a microstructure comprising the first conductive layer, the layer containing polycrystalline silicon, and the first insulating layer by removing a portion or a whole of the first sacrificial layer and the second sacrificial layer by etching;

forming an interlayer insulating layer over the microstructure;

forming a connection conductive layer over the interlayer insulating layer, wherein the connection conductive layer is electrically connected to the microstructure; and separating the microstructure from the first substrate.

12. The method for manufacturing a semiconductor device according to claim 11 further comprising the steps of:

forming a second insulating layer over a second substrate; and attaching the first substrate and the second substrate so that they are opposite to each other.

13. The method for manufacturing a semiconductor device according to claim 12 further comprising the steps of:

providing a contact hole in the first insulating layer;

forming a second conductive layer containing a metal element or a metal compound over the first insulating layer and in the contact hole;

removing a portion or a whole of the first sacrificial layer and the second sacrificial layer by etching; and forming a third conductive layer containing a metal element or a metal compound over the second insulating layer, wherein the first substrate and the second substrate are attached using an anisotropic conductive material so that the second conductive layer and the third conductive layer are electrically connected to each other.

14. The method for manufacturing a semiconductor device according to claim 12 further comprising the steps of:

providing a first contact hole in the first insulating layer;
forming a second conductive layer containing a metal element or a metal compound over the first insulating layer and in the first contact hole;
forming a third insulating layer over the second conductive layer;
providing a second contact hole in the third insulating layer;
forming a third conductive layer containing a metal element or a metal compound over the third insulating layer and in the second contact hole;
removing a portion or a whole of the first sacrificial layer and the second sacrificial layer by etching; and
forming a fourth conductive layer containing a metal element or a metal compound over the second insulating layer,
wherein the first substrate and the second substrate are attached using an anisotropic conductive material so that the third conductive layer and the fourth conductive layer are electrically connected to each other.

15. The method for manufacturing a semiconductor device according to claim 12,
wherein the second insulating layer is formed in a region which is not opposite to a region where a portion or a whole of the first sacrificial layer and the second sacrificial layer is removed by etching.

16. The method for manufacturing a semiconductor device according to claim 11,
wherein the first substrate comprises an insulating surface.

17. The method for manufacturing a semiconductor device according to claim 11,
wherein the metal is added selectively to a layer to be the layer containing polycrystalline silicon.

18. The method for manufacturing a semiconductor device according to claim 11,
wherein the layer containing polycrystalline silicon comprises a layered structure of polycrystalline silicon that is crystallized by thermal crystallization or laser crystallization using the metal and amorphous silicon.

19. The method for manufacturing a semiconductor device according to claim 11,
wherein the metal used for crystallization of polycrystalline silicon is one or more of Ni, Fe, Ru, Rh, Pd, Os, Ir, Pt, Cu, and Au.

20. The method for manufacturing a semiconductor device according to claim 11,
wherein the layer containing polycrystalline silicon is movable.

21. A method for manufacturing a semiconductor device comprising the steps of:
forming a microstructure comprising a layer containing silicon over a first substrate;
forming an interlayer insulating layer over the microstructure;
forming a connection conductive layer over the interlayer insulating layer, wherein the connection conductive layer is electrically connected to the microstructure; and
separating the microstructure from the first substrate.

22. The method for manufacturing a semiconductor device according to claim 21 further comprising:
forming a release layer between the first substrate and the microstructure.

23. The method for manufacturing a semiconductor device according to claim 21 further comprising:
attaching a second substrate to a top surface side of the first substrate after forming the microstructure and before separating the microstructure.

24. The method for manufacturing a semiconductor device according to claim 21 further comprising:
attaching the microstructure to a third substrate after separating the microstructure from the first substrate.

25. The method for manufacturing a semiconductor device according to claim 24,
wherein the third substrate is a flexible substrate.

26. The method for manufacturing a semiconductor device according to claim 21 further comprising:
forming a thin film transistor over the first substrate.

27. A method for manufacturing a semiconductor device comprising the steps of:
forming a release layer over a first substrate;
forming a microstructure comprising a layer containing silicon over the release layer;
forming an interlayer insulating layer over the microstructure;
forming a connection conductive layer over the interlayer insulating layer, wherein the connection conductive layer is electrically connected to the microstructure;
forming an opening to expose the release layer;
removing the release layer by introducing an etchant into the opening; and
separating the microstructure from the first substrate.

28. The method for manufacturing a semiconductor device according to claim 27 further comprising:
attaching a second substrate to a top surface side of the first substrate after forming the microstructure and before separating the microstructure.

29. The method for manufacturing a semiconductor device according to claim 27 further comprising:
attaching the microstructure to a third substrate after separating the microstructure from the first substrate.

30. The method for manufacturing a semiconductor device according to claim 29,
wherein the third substrate is a flexible substrate.

31. The method for manufacturing a semiconductor device according to claim 27 further comprising:
forming a thin film transistor over the release layer.

32. The method for manufacturing a semiconductor device according to claim 27,
wherein the release layer is partly removed by introducing the etchant.

* * * * *